(12) United States Patent
Yamagami et al.

(10) Patent No.: US 7,379,379 B2
(45) Date of Patent: May 27, 2008

(54) STORAGE DEVICE EMPLOYING A FLASH MEMORY

(75) Inventors: Hajime Yamagami, Yokohama (JP);
Kouichi Terada, Yokohama (JP);
Yoshihiro Hayashi, Narashino (JP);
Takashi Tsunehiro, Ebina (JP);
Kunihiro Katayama, Yokohama (JP);
Kenichi Kaki, Yokohama (JP); Takeshi Furuno, Kodaira (JP)

(73) Assignee: Solid State Storage Solutions LLC, Madison, WI (US)

( * ) Notice: Subject to any disclaimer, the term of this patent is extended or adjusted under 35 U.S.C. 154(b) by 0 days.

(21) Appl. No.: 11/599,308

(22) Filed: Nov. 15, 2006

(65) Prior Publication Data

US 2007/0070694 A1 Mar. 29, 2007

Related U.S. Application Data

(63) Continuation of application No. 11/085,507, filed on Mar. 22, 2005, now Pat. No. 7,154,805, which is a continuation of application No. 10/847,917, filed on May 19, 2004, now Pat. No. 6,925,012, which is a continuation of application No. 10/409,080, filed on Apr. 9, 2003, now Pat. No. 6,788,609, which is a continuation of application No. 10/046,413, filed on Jan. 16, 2002, now Pat. No. 6,567,334, which is a continuation of application No. 09/866,622, filed on May 30, 2001, now Pat. No. 6,347,051, which is a continuation of application No. 09/660,648, filed on Sep. 12, 2000, now Pat. No. 6,341,085, which is a continuation of application No. 08/782,344, filed on Jan. 13, 1997, now Pat. No. 6,130,837, which is a continuation of application No. 07/981,438, filed on Nov. 25, 1992, now Pat. No. 5,644,539.

(30) Foreign Application Priority Data

| Nov. 26, 1991 | (JP) | 3-310848 |
| Nov. 28, 1991 | (JP) | 3-314297 |
| Feb. 19, 1992 | (JP) | 4-031756 |
| Apr. 20, 1992 | (JP) | 4-099891 |

(51) Int. Cl.
*G11C 8/00* (2006.01)

(52) U.S. Cl. .......................... 365/230.08; 365/230.01; 365/230.03

(58) Field of Classification Search ........... 365/230.08, 365/230.01, 230.03
See application file for complete search history.

(56) References Cited

U.S. PATENT DOCUMENTS 4,530,054 A 7/1985 Hamstra et al.

(Continued)

FOREIGN PATENT DOCUMENTS

DE 2840305 3/1980

(Continued)

OTHER PUBLICATIONS

Computer Technology Review, "Flash Memory for Top Speeds in Mobile Computing", vol. 12 No. 7, Jun. 1992, pp. 36-37.

(Continued)

*Primary Examiner*—Viet Q. Nguyen
(74) *Attorney, Agent, or Firm*—Mattingly, Stanger, Malur & Brundidge, P.C.

(57) ABSTRACT

A semiconductor disk wherein a flash memory into which data is rewritten in block unit is employed as a storage medium, the semiconductor disk including a data memory in which file data are stored, a substitutive memory which substitutes for blocks of errors in the data memory, an error memory in which error information of the data memory are stored, and a memory controller which reads data out of, writes data into and erases data from the data memory, the substitutive memory and the error memory. Since the write errors of the flash memory can be remedied, the service life of the semiconductor disk can be increased.

9 Claims, 24 Drawing Sheets

U.S. PATENT DOCUMENTS

| | | |
|---|---|---|
| 4,563,752 A | 1/1986 | Pelgrom et al. |
| 4,841,482 A | 6/1989 | Kreifels et al. |
| 4,899,272 A | 2/1990 | Fung et al. |
| 4,922,456 A | 5/1990 | Naddor et al. |
| 4,924,375 A | 5/1990 | Fung et al. |
| 5,043,940 A | 8/1991 | Harari |
| 5,053,990 A | 10/1991 | Kreifels et al. |
| 5,065,364 A | 11/1991 | Atwood et al. |
| 5,092,463 A | 3/1992 | Dees |
| 5,095,344 A | 3/1992 | Harari |
| 5,245,572 A | 9/1993 | Kosonocky et al. |
| 5,263,003 A | 11/1993 | Cowles et al. |
| 5,267,218 A | 11/1993 | Elbert |
| 5,268,870 A | 12/1993 | Harari |
| 5,280,447 A | 1/1994 | Hazen et al. |
| 5,295,255 A | 3/1994 | Malecek et al. |
| 5,297,148 A * | 3/1994 | Harari et al. ............... 714/710 |
| 5,341,339 A | 8/1994 | Wells |
| 5,341,489 A | 8/1994 | Heiberger et al. |
| 5,357,473 A | 10/1994 | Mizuno et al. |
| 5,359,569 A | 10/1994 | Fujita et al. |
| 5,369,616 A | 11/1994 | Wells et al. |
| 5,418,621 A * | 5/1995 | Park ........................... 386/35 |
| 5,418,752 A | 5/1995 | Harari et al. |
| 5,428,621 A * | 6/1995 | Mehrotra et al. ........... 714/721 |
| 5,430,859 A * | 7/1995 | Norman et al. ............. 711/103 |
| 5,437,020 A * | 7/1995 | Wells et al. ................... 714/6 |
| 5,454,096 A | 9/1995 | Otsuka et al. |
| 5,524,230 A | 6/1996 | Sakaue et al. |
| 5,530,673 A | 6/1996 | Tobita et al. |
| 5,530,828 A | 6/1996 | Kaki et al. |
| 5,535,328 A | 7/1996 | Harari et al. |
| 5,572,466 A | 11/1996 | Sukegawa |
| 5,630,093 A | 5/1997 | Holzhammer et al. |
| 5,644,539 A | 7/1997 | Yamagami et al. |
| 5,661,800 A | 8/1997 | Nakashima et al. |
| 5,663,901 A | 9/1997 | Wallace et al. |
| 5,671,229 A | 9/1997 | Harari |
| 5,673,383 A | 9/1997 | Sugegawa |
| 5,689,676 A | 11/1997 | Hirose et al. |
| 5,696,917 A | 12/1997 | Mills et al. |
| 5,696,929 A | 12/1997 | Hasbun |
| 5,719,808 A | 2/1998 | Harari |
| 5,724,285 A | 3/1998 | Shinohara |
| 5,734,887 A | 3/1998 | Kingberg et al. |
| 5,737,764 A | 4/1998 | Shigeeda |
| 5,742,934 A | 4/1998 | Shinohara |
| 5,774,396 A | 6/1998 | Lee et al. |
| 5,778,425 A | 7/1998 | Shigeeda |
| 5,802,551 A | 9/1998 | Komatsu et al. |
| 5,805,854 A | 9/1998 | Shigeeda |
| 5,812,814 A | 9/1998 | Sukegawa |
| 5,862,083 A | 1/1999 | Tobita et al. |
| 5,905,993 A | 5/1999 | Shinohara .................... 711/103 |
| 5,943,692 A | 8/1999 | Marberg et al. |
| 5,953,513 A | 9/1999 | Saiki et al. |
| 5,963,983 A | 10/1999 | Sakakura et al. |
| 5,973,964 A | 10/1999 | Tobita et al. ........... 365/185.29 |
| 5,983,312 A | 11/1999 | Komatsu et al. |
| 6,000,006 A | 12/1999 | Bruce et al. |
| 6,078,520 A | 6/2000 | Tobita et al. |
| 6,081,447 A | 6/2000 | Lofgren et al. |
| 6,125,424 A | 9/2000 | Komatsu et al. |
| 6,130,837 A | 10/2000 | Yamagami et al. |
| 6,131,139 A | 10/2000 | Kikuchi et al. |
| 6,230,233 B1 | 5/2001 | Lofgren et al. |
| 6,266,792 B1 | 7/2001 | Wada et al. |
| 6,341,085 B1 | 1/2002 | Yamagami et al. |
| 6,347,051 B2 | 2/2002 | Yamagami et al. |
| 6,374,324 B2 | 4/2002 | Han |
| 6,430,650 B1 | 8/2002 | Miyauchi |
| 6,567,334 B2 | 5/2003 | Yamagami et al. |
| 6,766,409 B2 | 7/2004 | Komatsu et al. ............ 711/103 |
| 6,788,609 B2 | 9/2004 | Yamagami et al. |
| 6,839,826 B2 | 1/2005 | Carnea ....................... 711/202 |
| 6,925,012 B2 | 8/2005 | Yamagami et al. |
| 7,002,851 B2 | 2/2006 | Yamagami et al. |
| 7,006,386 B2 | 2/2006 | Yamagami et al. |
| 7,064,995 B2 | 6/2006 | Yamagami et al. |
| 7,082,510 B2 | 7/2006 | Yamagami et al. |
| 7,123,519 B2 | 10/2006 | Yamagami et al. |
| 2004/0208060 A1 | 10/2004 | Yamagami et al. .... 365/185.11 |
| 2005/0161901 A1 | 7/2005 | Ahner et al. ................. 280/432 |
| 2005/0162899 A1 | 7/2005 | Yamagami et al. ......... 365/158 |
| 2005/0162900 A1 | 7/2005 | Yamagami et al. ......... 365/158 |
| 2005/0162902 A1 | 7/2005 | Yamagami et al. ......... 365/158 |
| 2005/0166080 A1 | 7/2005 | Yamagami et al. ............ 714/8 |
| 2005/0169045 A1 | 8/2005 | Yamagami et al. ......... 365/158 |

FOREIGN PATENT DOCUMENTS

| | | |
|---|---|---|
| DE | 3200872 | 7/1983 |
| EP | 0392895 | 10/1990 |
| EP | 000477503 A2 * | 4/1992 |
| EP | 04921056 | 7/1992 |
| EP | 0522780 | 1/1993 |
| EP | 0569040 | 11/1993 |
| EP | 0615193 | 9/1994 |
| GB | 2251323 | 7/1992 |
| GB | 2251324 | 7/1992 |
| JP | 62036799 | 2/1987 |
| JP | 1235075 | 9/1989 |
| JP | 1251372 | 10/1989 |
| JP | 1292455 | 11/1989 |
| JP | 1298420 | 12/1989 |
| JP | 2189790 | 7/1990 |
| JP | 02289997 | 11/1990 |
| JP | 02292798 | 12/1990 |
| JP | 2292798 | 12/1990 |
| JP | 2311935 | 12/1990 |
| JP | 325798 | 2/1991 |
| JP | 330034 | 2/1991 |
| JP | 3127116 | 5/1991 |
| JP | 03252993 | 11/1991 |
| JP | 3283094 | 12/1991 |
| JP | 04033029 | 2/1992 |
| JP | 04057295 | 2/1992 |
| JP | 4123243 | 4/1992 |
| JP | 4243096 | 8/1992 |
| JP | 527924 | 2/1993 |
| JP | 5027924 | 2/1993 |
| JP | 5028039 | 2/1993 |
| JP | 5204561 | 8/1993 |
| JP | 5241741 | 9/1993 |
| JP | 05324000 | 12/1993 |
| JP | 4916149 | 6/1997 |
| JP | 409282111 | 10/1997 |
| JP | 2001243110 | 9/2001 |
| WO | 9218928 | 10/1992 |
| WO | 9311491 | 6/1993 |

OTHER PUBLICATIONS

Communications of the Association for Computing Machinery, "Asymmetric Memory Hierarchies", vol. 16, No. 4, Apr. 1973, pp. 213-222.

F. Masuoka, 256K bit EEPROM Going as far as Substituting with the Ultraviolet Rays Erasing Type EPROM—just providing Erasing Gates with the EPROM, Nikkei Electronics, 1985, Jul. 29, 1999, No. 374, pp. 195-209, Nikkei-McGraw Hill.

J.S. Chen, et al, "Contact Resistivity of Re, Pt and Ta films on n-type B-SIC: Preliminary Result",Elsevier Science S.A., SSDI 0921-5107 (94) 04049-4, Materials Science and Engineering B29 (1995) pp. 185-189.

* cited by examiner

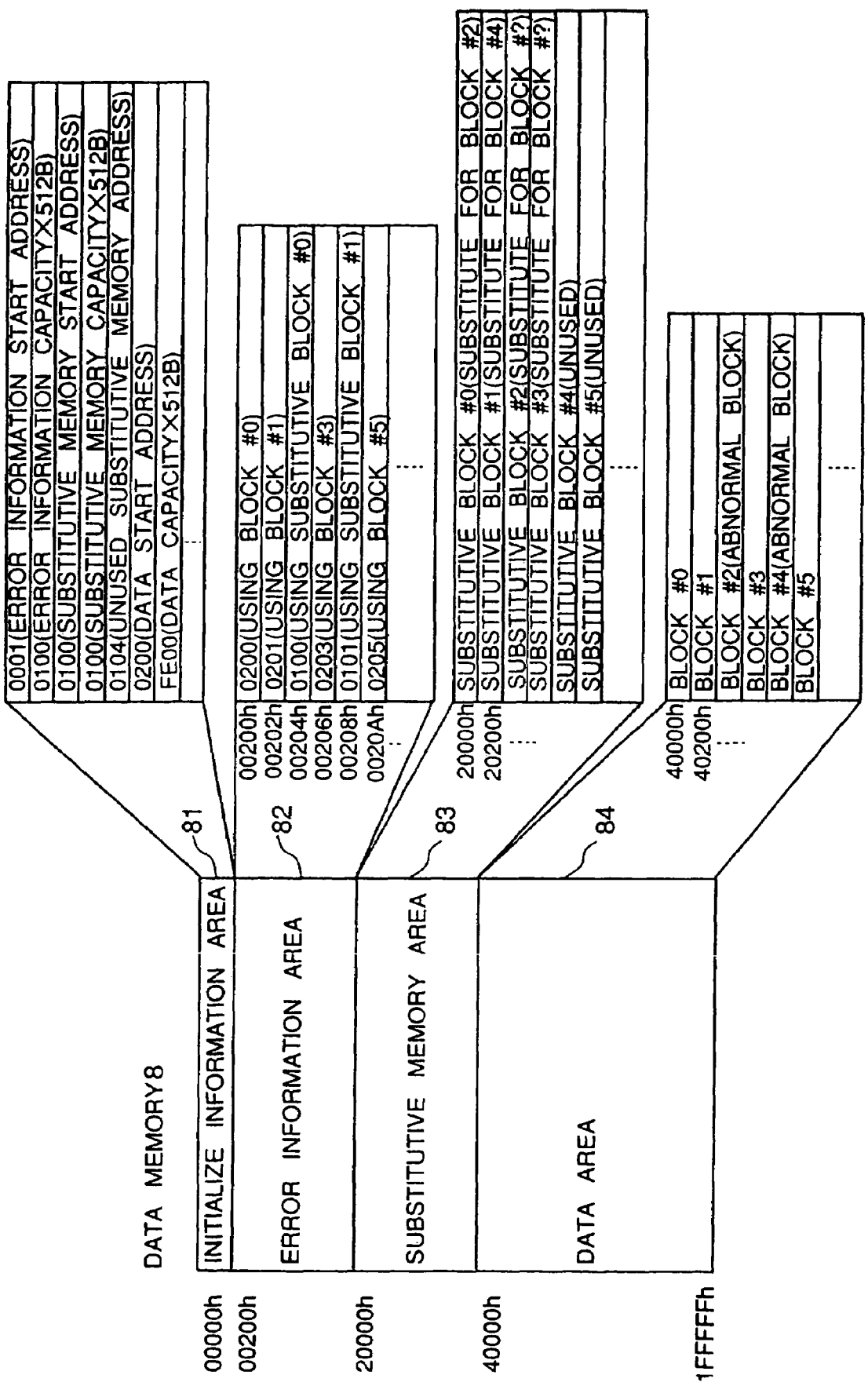

STORAGE DEVICE EMPLOYING A FLASH MEMORY

This application is a continuation of application Ser. No. 11/085,507, filed Mar. 22, 2005; now U.S. Pat. No. 7,154,805 which is a continuation of U.S. application Ser. No. 10/847,917, filed May 19, 2004, now U.S. Pat. No. 6,925,012; which in turn, is a continuation of U.S. application Ser. No. 10/409,080, filed Apr. 9, 2003, now U.S. Pat. No. 6,788,609, which, in turn, is a continuation of U.S. application Ser. No.10/046,413, filed Jan. 16, 2002, now U.S. Pat. No. 6,567,334, which, in turn, is a continuation of U.S. application Ser. No. 09/866,622, filed May 30, 2001, now U.S. Pat. No. 6,347,051, which, in turn, is a continuation of U.S. application Ser. No. 09/660,648, filed Sep. 12, 2000, now U.S. Pat. No. 6,341,085, which, in turn, is a continuation of U.S. application Ser. No. 08/782,344, filed Jan. 13,1997, now U.S. Pat. No. 6,130,837, and which, in turn, is a continuation of U.S. application Ser. No. 07/981,438, filed Nov. 25, 1992, now U.S. Pat. No. 5,644,539; and the entire disclosures of which are incorporated herein by reference.

BACKGROUND OF THE INVENTION

The present invention relates to a storage device employing a flash memory. More particularly, it relates to a method of extending the service life of such a storage device.

A magnetic storage device is the most commonly used prior-art auxiliary storage for information equipment. With the magnetic storage device, a file to be written thereinto is divided into a data storing unit called a "sector", and it is stored in correspondence with the physical position of a storage medium. That is, in rewriting a certain file, the data of the file are written into basically the same position. Herein, when the quantity of data to be written has increased, new sectors are used for the increased data. Also, an optical disk storage device is mentioned as another auxiliary storage. The optical disk storage device which is conventional in the art at present can write data thereinto only once, and cannot erase data therefrom. In rewriting a file written once, accordingly, an actual rewriting operation is not performed, but the data of the file are written into a different part of the storage area. The data of the file written before are invalidated so as not to be read out thenceforth. That is, unlike the magnetic disk storage device, the optical disk storage device fulfills the function of the auxiliary storage in accordance with the scheme that the rewritten data and the locations thereof are not correlated at all.

In recent years, a semiconductor file storage device has been designated for use as an auxiliary storage, which employs a semiconductor memory in contrast to the above storage devices in each of which a disk is rotated to access the data of large capacity at high speed. In particular, a device employing a nonvolatile memory which is electrically rewritable (hereinbelow, expressed as the "EEPROM" short for electrically erasable and programmable read-only memory) will form the mainstream of the semiconductor file storage device in the future.

A technique which concerns the storage device employing the EEPROM is disclosed in the official gazette of Japanese Patent Application Laid-open No. 25798/1991. This technique is intended to realize a practical storage device by the use of the EEPROM in spite of the drawback of the EEPROM which limits the number of rewriting erase operations. To sum up, a plurality of memory elements (EEPROM elements) are prepared, and the number of rewriting erase operations of the individual elements are recorded and managed. When one of the memory elements has reached a prescribed number of operations below the guaranteed number of rewrite operations of the EEPROM, it is changed-over to another memory element, which is then used for storing data. Thus, the stored data are protected.

The prior-art storage devices mentioned above will be discussed further.

According to the scheme of the optical disk storage device, each time the file is rewritten, the part of the storage area corresponding thereto is ruined. This incurs the problem that a satisfactory storage area cannot be secured without a storage medium having a very large capacity. Especially in the case of the storage device of the information equipment in which the files are frequently rewritten, the required storage area increases even when the actual capacity for storing the data of the files is not very large.

On the other hand, with the magnetic disk storage device which is the most commonly used as the auxiliary storage, when the file written once is to be rewritten, advantageously the new data are written into the same part of a storage area. In the application of such a rewriting operation to the EEPROM, however, a file (usually called "directory file") for listing the stored data files, a file ("file allocation table") for referring to the locations of the data files, etc. need to be rerecorded at each access for writing data, so that the rewriting operations concentrate locally. As a result, the EEPROM which has a limited number of writing erase operations has its service life shortened drastically.

The technique utilizing the EEPROM as disclosed in the official gazette of Japanese Patent Application Laid-open No. 25798/1991, consists of the scheme whereby the deteriorated state of the memory element is grasped in terms of the number of erase operations, whereupon the memory element is changed-over to the substitutive memory element before being ruined. This scheme necessitates a memory capacity which is, at least, double the actual capacity for storing the data of files. That is, the substitutive memory element is not used at all until the memory element used first is ruined. Besides, the ruined memory element is then quite unnecessary. These conditions render the physical volume and weight of the storage device very wasteful. Moreover, since all the data of the memory element are not usually rewritten, it is uneconomical that the memory chip having been only partly deteriorated is entirely brought into the state of nonuse.

It is accordingly desired to realize a semiconductor file storage device which has a longer service life and which is smaller in size and more economical.

Meanwhile, a DRAM (dynamic random access memory) or an SRAM (static random access-memory) has been employed as the storage medium of a semiconductor disk storage device. Also, a flash memory has been known as one sort of EEPROM.

With the flash memory, data can be read therefrom in small data units, such as in bytes or word units, as in the case of the DRAM or the SRAM. Since, however, the flash memory is limited in the number of rewrite operations, data are written thereinto by reducing the number of rewrite operations in such a way that a rewriting unit is set at a block unit such as of 512 bytes.

Also, it is structurally required of the flash memory to erase data before the rewriting operation. Therefore, some flash memory devices are endowed with the command process functions of "erase" etc.

Anyway, the limited number of rewrite operations is the most serious problem in the case where the flash memory is employed as the storage medium of a semiconductor disk storage device. Since a directory area and an FAT (file allocation table) area, for example, are rewritten more frequently than the other areas, only the specified blocks of the flash memory for the directory and FAT areas are more liable to exceed the limit of rewrite operations of the flash memory. Consequently, the whole semiconductor disk becomes unusable due to the abnormalities of only the specified blocks, and the semiconductor disk is of low reliability on account of the short service life thereof.

It is accordingly desired to realize a semiconductor disk storage device which has a longer service life.

SUMMARY OF THE INVENTION

An object of the present invention is to provide a storage device employing a flash memory, which has a longer service life and which is smaller in size and more economical then conventional storage devices.

Another object of the present invention is to extend the service life of a semiconductor disk storage device employing a flash memory.

In one aspect of performance of the present invention, a storage device employing a flash memory comprises a storage area which is divided into physical areas that are identified by physical area identification information; logical area conversion means supplied with logical area identification information being virtual identification information in an operation of writing data, for converting the logical area identification information into the physical area identification information corresponding thereto in the case of writing the data into a logical area; and a memory controller which receives the physical area identification information resulting from the conversion, and which writes the data into the physical area; the logical area conversion means being capable of converting the identical logical area identification information into the plurality of items of physical area identification information.

In operation, when the physical area into which the data is to be written is normal, the memory controller writes the data into this physical area. On the other hand, when the physical area is abnormal, the memory controller writes the data into another of the physical areas based on the logical area identification information.

BRIEF DESCRIPTION OF THE DRAWINGS

FIG. 7 is a diagram for explaining the memory map of a data memory which is included in the semiconductor disk storage device of the second embodiment;

PREFERRED EMBODIMENTS OF THE INVENTION

Figure 1:
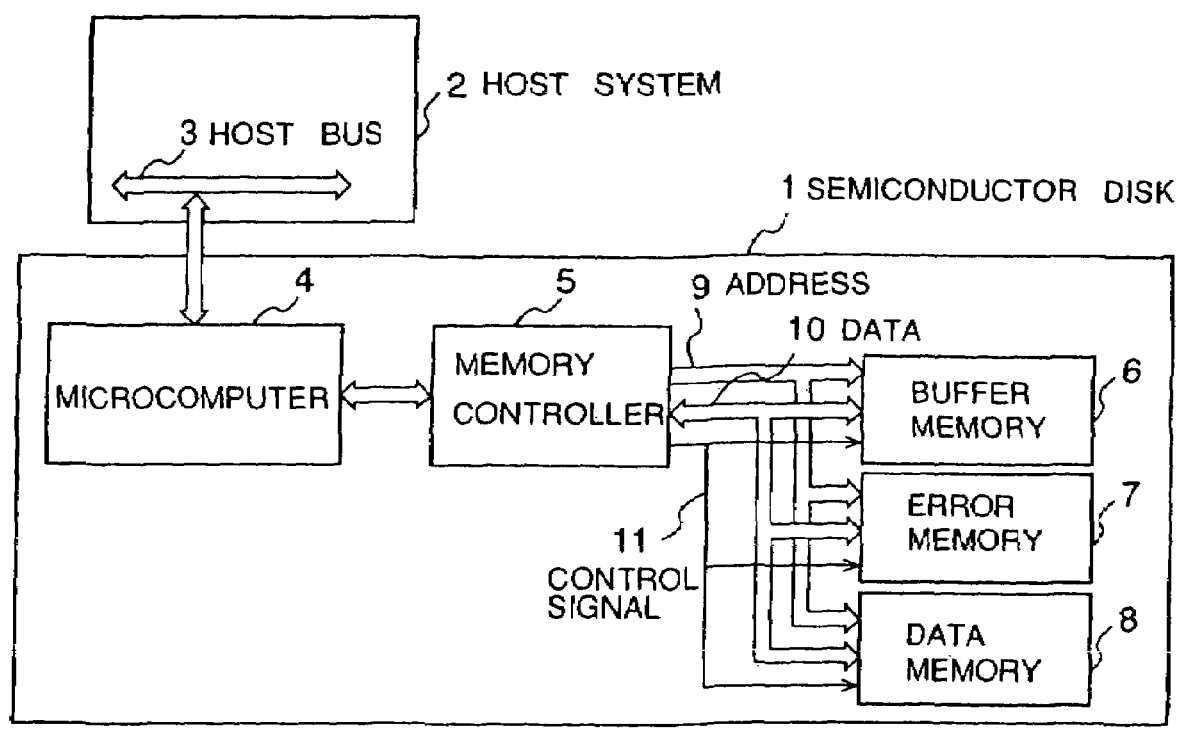
FIG. 1 is a block diagram showing a semiconductor disk storage device and a host system in the first embodiment of the present invention.

FIG. 1 is a block diagram of the first embodiment of the present invention. Referring to the figure, numeral 1 indicates a semiconductor disk storage device, which is connected to the host bus 3 of a host system 2. The semiconductor disk storage device 1 comprises a microcomputer 4 (functioning as logical area conversion means, instruction acceptance means and instruction conversion means), a memory controller 5, a buffer memory 6, an error memory 7 and a data memory 8. The buffer memory 6 is a memory in which data to be written into the data memory 8 and the error memory 7 or data read out of them are temporarily stored, and which is constructed of an SRAM which simplifies data fetching and latching operations. The data memory 8 is constructed of sixteen flash memory elements of 2 MB each. Accordingly, the storage capacity of the semiconductor disk storage device 1 is 32 MB. The error memory 7 is constructed of a flash memory element of 512 KB, and it stores therein the error information of the data memory 8 and the data of the blocks of the data memory 8 undergoing errors. Both the data memory 8 and the error memory 7 have data written thereinto in block units of 512 bytes. The microcomputer 4 receives an instruction from the host bus 3, and controls the memory controller 5 in accordance with the instruction. The memory controller 5 controls the read and write operations of the buffer memory 6, error memory 7 and data memory 8 by the use of addresses 9, data 10 and control signals 11. In addition, since the error memory 7 and the data memory 8 require erase operations, the memory controller 5 controls the erase operations.

Figure 2:
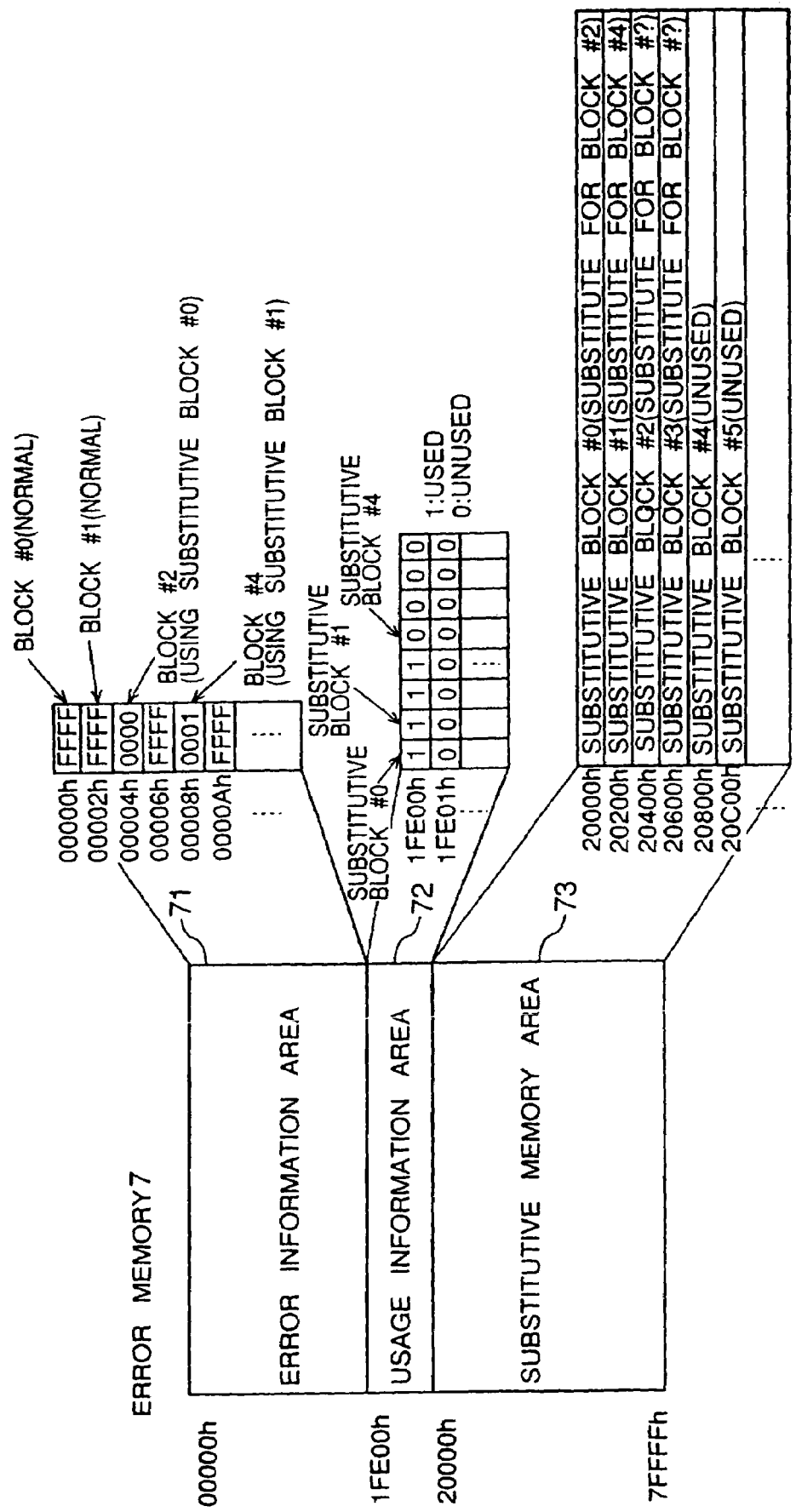
FIG. 2 is a diagram for explaining the memory map of an error memory which is included in the semiconductor disk storage device of the first embodiment.

FIG. 2 illustrates an example of the memory map of the error memory 7. The memory map consists of the three areas of an error information area 71, a usage information area 72 and a substitutive memory area 73. These areas need to be separated in agreement with the boundaries of data writing blocks. The error information area 71 is the area in which the error information corresponding to the individual blocks of the data memory 8 are stored. When the block is normal, the error information is denoted by FFFFh, and when the block is abnormal, the error information indicates the number of the block of the substitutive memory area 73 substituting for the abnormal block. The usage information area 72 is the area which expresses the usage situation of the substitutive memory area 73, and in which usage information corresponding to the individual substitutive blocks of the substitutive memory area 73 are stored. As the usage information, one bit is allotted to each of the substitutive blocks. When the corresponding substitutive block is used or occupied as the substitute, the usage information is denoted by "1", and when not, the usage information is denoted by "0". The unused or unoccupied block of the substitutive memory area 73 can be found by seeking the bit of "0" in the usage information area 72. The substitutive memory area 73 is the area which substitutes for the error blocks of the data memory 8. It is configured of the same 512-byte blocks as those of the data memory 8, and the respective blocks are endowed with the Nos. of the substitutive blocks successively from an address 20000 h.

Figure 3:
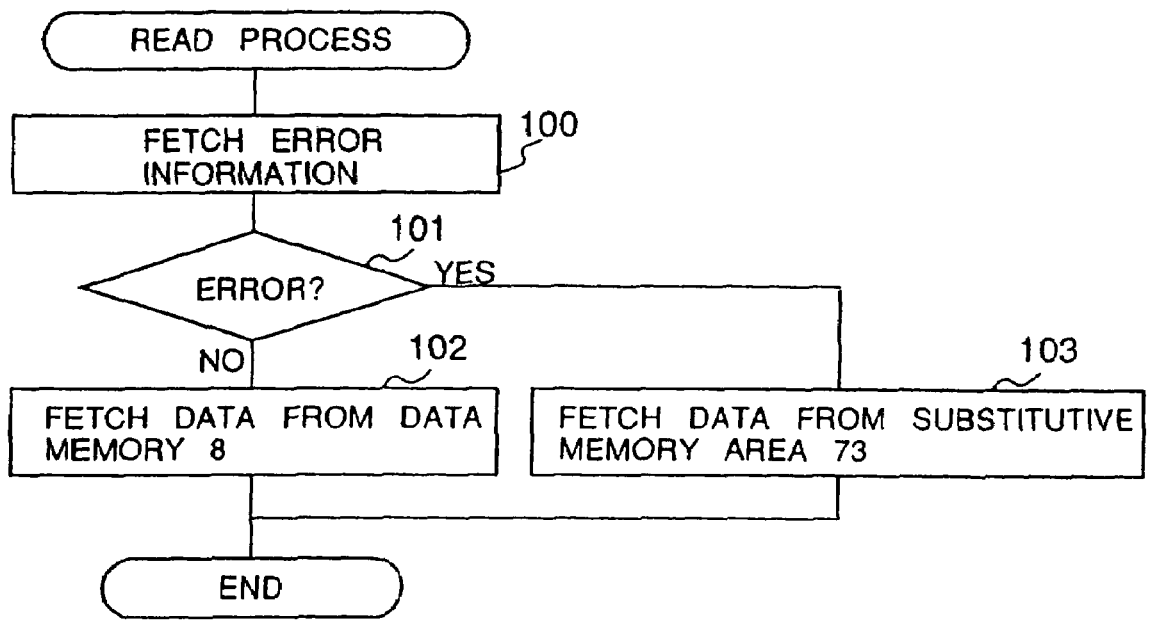
FIG. 3 is a flow chart of a read process which is executed by a microcomputer in the first embodiment.

Now, the operation of the semiconductor disk storage device 1 in this embodiment will be explained. It is first assumed that an instruction for reading out file data has been received from the host bus 3. In this case, the microcomputer 4 processes the instruction, but the control contents thereof differ depending upon the ways in which the instruction is given. For example, in a case where the allocation information of the file data to be read out is afforded in terms of a sector number or a track number as in a magnetic disk storage device etc., the sector or track number needs to be converted into the physical address of the data memory 8. In this embodiment, for the sake of brevity, the allocation information from the host bus 3 is assumed to be the block number of the data memory 8. The block number corresponds to the upper bits of the physical address. FIG. 3 illustrates the processing steps of a read process in the case where the microcomputer 4 functions as the logical area conversion means. At the step 100, the error information of the block number delivered from the host bus 3 is fetched from the error information area 71 of the error memory 7. By way of example, in the case of reading out the data of block #1, the error information of the address 00002 h of the error memory 7 is fetched, and in the case of reading out the data of block #2, the error information of the address 00004h is fetched. At the next step 101, whether or not the pertinent block is normal is checked in view of the fetched error information. In the case of the block #1, the error information is "FFFFh", so 10 that the block #1 is found to be normal. In contrast, in the case of the block 12, the error information is "0000h", so that the block #2 is found to be abnormal. When the pertinent block is normal, as is the block #1, the data of 512 bytes are fetched from the block #1 of the data memory 8 and then transferred to the host bus 3 at the step 102. On the other hand, when the pertinent block is abnormal, as with the block 12, the data of 512 bytes are fetched from the substitutive block #0 of the substitutive memory area 73 indicated by the error information "0000h" and then transferred to the host bus 3 at the step 103. Here, the fetch of the information from the error memory 7, the fetch of the data from the data memory 8 and the transfer of the data to the host bus 3 are effected under the control of the microcomputer 4 by the memory controller 5. In this manner, in the operation of reading out the file data, the error information is fetched before reading out the desired block, thereby checking if the pertinent block is normal. In the case of the normal block, the block of the data memory 8 is read out, whereas in the case of the abnormal block, the substitutive block of the substitutive memory area 73 is read out.

Figure 4:
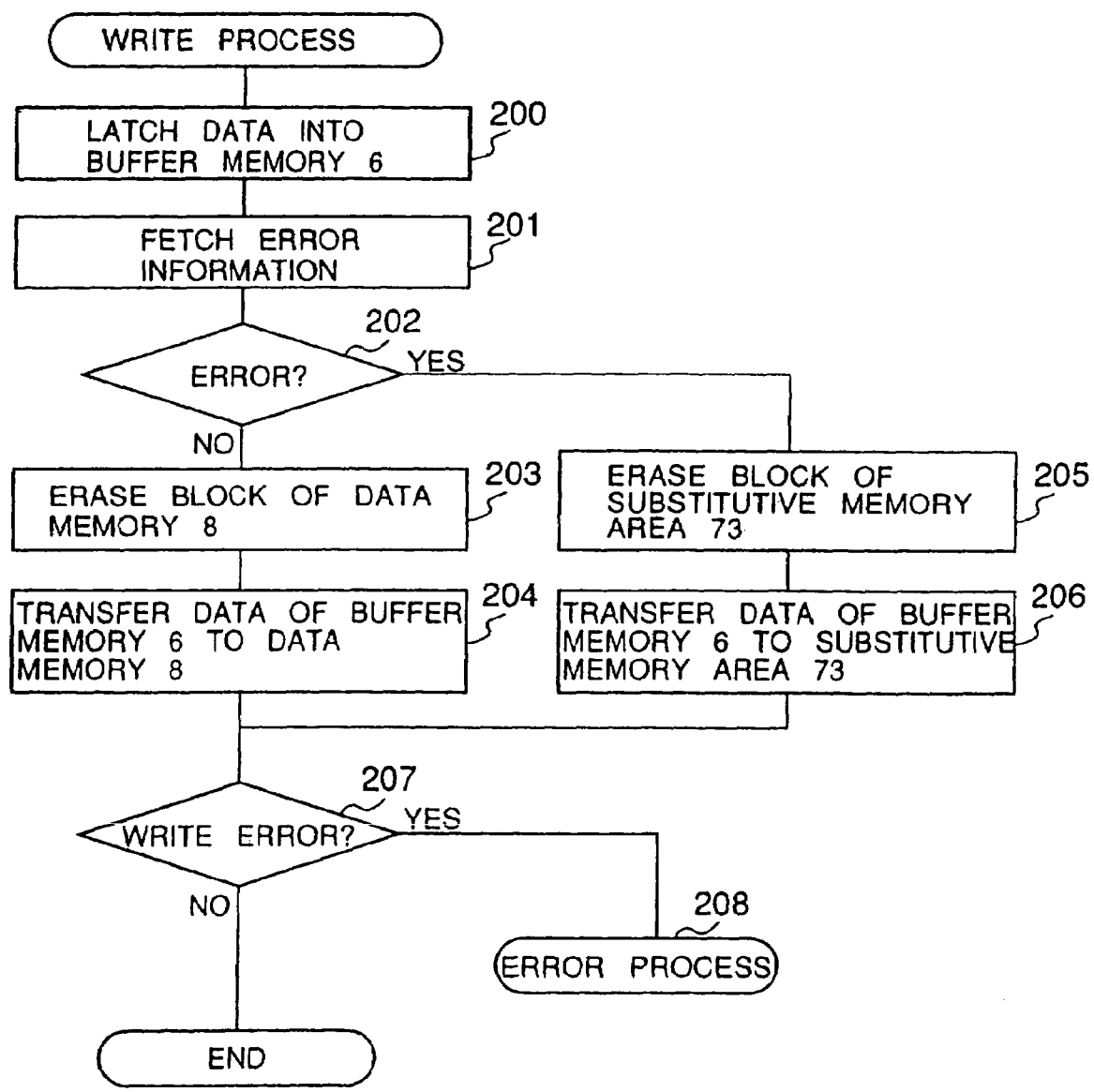
FIG. 4 is a flow chart of a write process which is executed by the microcomputer in the first embodiment.

Next, let's consider a case where an instruction for writing file data has been received from the host bus 3. FIG. 4 illustrates the processing steps of a write process which is executed by the microcomputer 4. At the step 200, the microcomputer 4 supplies the buffer memory 6 with the file data delivered from the host bus 3. This operation of transferring the file data to the buffer memory 6 is performed in order to reduce the wait time of the host system 2 for the reason that a longer time is expended on the write operation of the flash memory than on the read operation thereof. At the step 201, the error information of the No. of a block into which the file data are to be written is fetched from the error information area 71 of the error memory 7. As in the case of the read operation, the error information is checked at the step 202. By way of example, the block #1 has the error information "FFFFh" and is therefore the normal block, and the block #2 has the error information "0000h" and is therefore the abnormal block. When the file data are to be written into the block #1, the routine proceeds to the step 203 because of the normal block. In this case, the data of the block #1 of the data memory 8 are erased at the step 203, and the file data latched in the buffer memory 6 are written into the block #1 of the data memory 8 at the step 204. On the other hand, when the file data are to be written into the block #2, the routine proceeds to the step 205 because of the abnormal block. In this case, the data of the substitutive block #0 of the substitutive memory area 73 indicated by the value "0000h" of the error information are erased at the step 205, and the file data of the buffer memory 6 are written into the substitutive block #0 at the step 206. Subsequently, whether the data have been normally written into the data memory 8 or the error memory 7 is checked at the step 207. A write error develops in the flash memory in a case where the limit of the number of rewrite operations of this flash memory has been exceeded due to the frequent write operations of only a specified block. When the normal write operation is decided at the checking step 207, the process of the file data writing instruction delivered from the host bus 3 is ended. On the other hand, when the write operation is decided to be abnormal, the step 208 functions to update the error information and to allocate a substitutive block.

Figure 5:
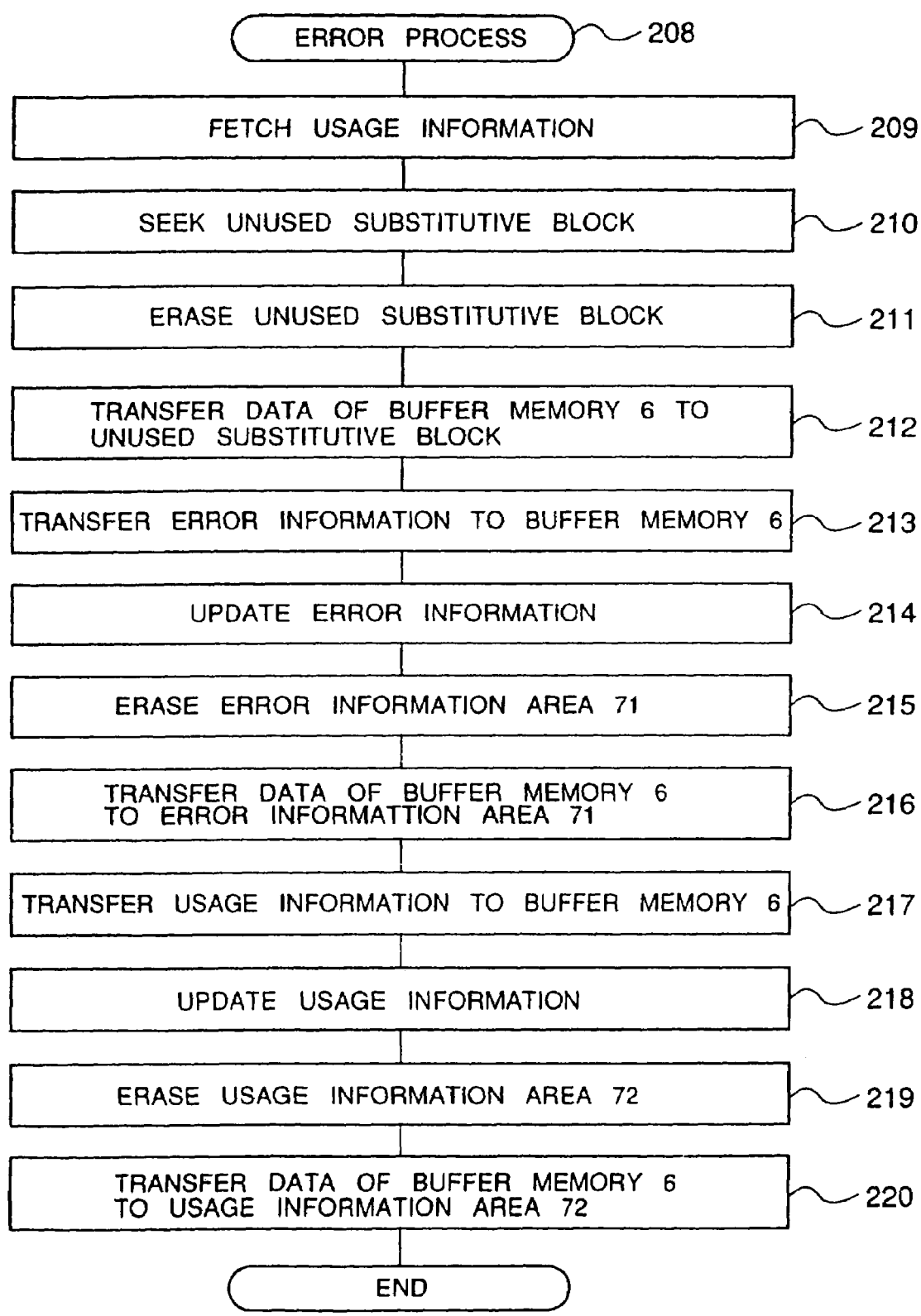
FIG. 5 is a flow chart of an error process which is executed by the microcomputer in the first embodiment.

FIG. 5 illustrates the steps of the error process 208 mentioned above. The usage information of the usage information area 72 in the error memory 7 is fetched at the step 209, and an unused substitutive block is sought in view of the usage information at the step 210. It is seen from FIG. 2 that the first thru fourth bits are "1's" signifying the used states of the corresponding substitutive blocks, and that the fifth bit is "0" signifying the unused state of substitutive block #4. Accordingly, the block which has undergone the write error is substituted by the substitutive block #4. Therefore, the data of the substitutive block #4 are erased at the step 211 (since the blocks themselves are variable in software fashion, any data might be stored in the substitutive blocks), and the file data of the buffer memory 6 are written into the substitutive block #4 at the step 212. Subsequently, the error information of blocks having undergone write errors as stored in the error information area 71 are transferred to the buffer memory 6 at the step 213. At the step 214, the error information latched in the buffer memory 6 are rewritten into new error information. By way of example, in the case of the write error of the block 41, the value "FFFFh" of the address "00002 h" is rewritten into the block No. "0004h" of the substitutive block #4. Further, the data of that block of the error information area 71 which needs to be rewritten are erased at the step 215, and the data of the buffer memory 6 are written into the original block of the error information area 71 at the step 216. Likewise, the usage information of the usage information area 72 are transferred to the buffer memory 6 at the step 217, and the bit of the substitutive block #4 to be newly used as a substitute this time is rewritten into "1" at the step 218. Subsequently, the data of the usage information area 72 are erased at the step 219, whereupon the data of the buffer memory 6 are written into the usage information area 72 at the step 220. Owing to the error processing steps stated above, the error block is replaced with the substitutive block, and the error information is updated.

In the exemplified processing of this embodiment, only the check of the write operation is performed at the step 207 in FIG. 4. However, a check concerning if the block has been normally erased may well be added at a step succeeding the erase operation of each of the steps 203 and 205. Also in this case, the error process of the step 208 is performed.

Although the substitutive memory area 73 and the error information area 71 are provided in the error memory 7 in this embodiment, they may well be formed by separate memory chips. On the contrary; an error information area and a substitutive memory area may well be provided in the data memory 8.

Figure 6:
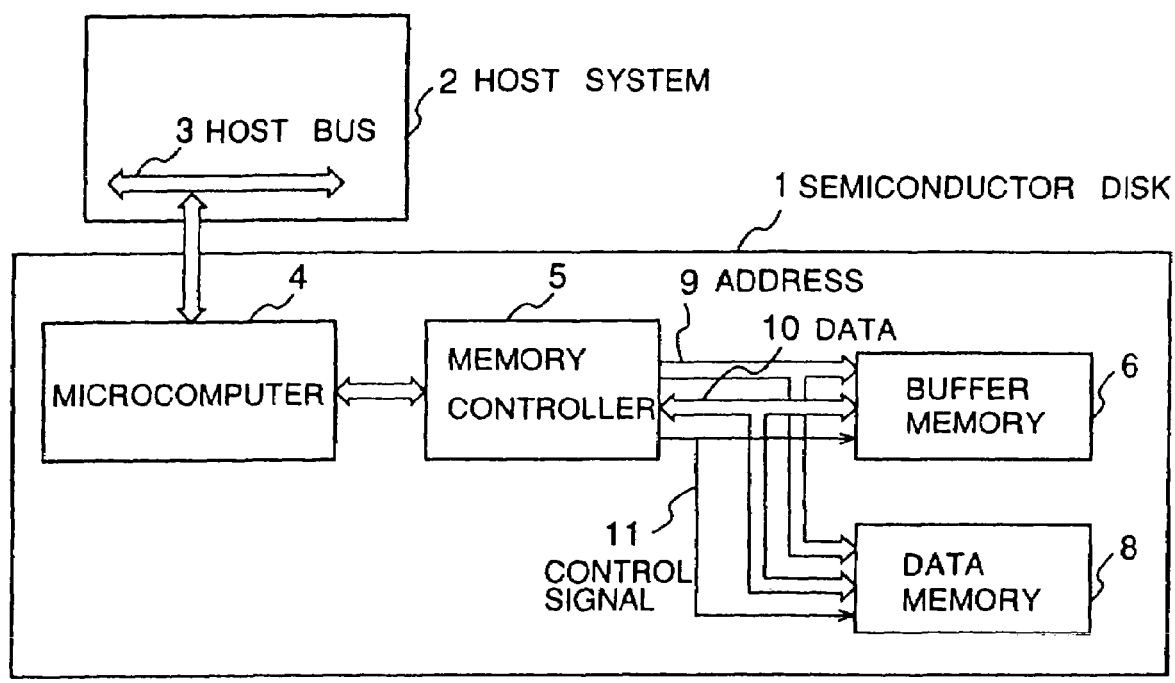
FIG. 6 is a block diagram showing a semiconductor disk storage device and a host system in the second embodiment of the present invention.

An architectural diagram in the latter case is illustrated in FIG. 6. In the second embodiment of FIG. 6, the error memory 7 is dispensed with, unlike the architecture of FIG. 1, so that the number of chips can be reduced.

FIG. 7 illustrates an example of the memory map of the data memory 8 of the embodiment in FIG. 6. As shown in FIG. 7, the data memory 8 is divided into the four areas of an initialize information area 81, an error information area 82, a substitutive memory area 83 and a data area 84. The substitutive memory area 83 is the area which substitutes for the blocks of the data area 84 having errors. The error information area 82 stores therein the address information of the respective blocks of the data area 84, and the address information of substitutive blocks corresponding to the error blocks of the data area 82. Here, each address information denotes the upper bits of the physical address or the number of the physical block of the data memory 8. The initialize information area 81 is the area in which the start addresses and storage capacities of the substitutive memory area 83, error information area 82 and data area 84 are stored, and in which the address information of the unused blocks of the substitutive memory area 83 are also stored. In initializing the semiconductor disk storage device 1, the user thereof sets the depicted initialize information area 81. Thus, they can set the size of the substitutive memory area 83 at will.

Figure 8:
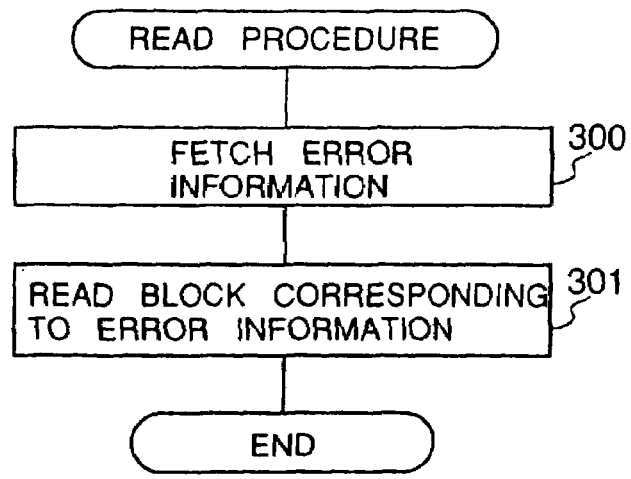
FIG. 8 is a flow chart of a read procedure which is executed by a microcomputer in the second embodiment.

Now, the operation of this embodiment will be explained. First, FIG. 8 illustrates the processing steps of the microcomputer 4 when the semiconductor disk storage device 1 has received a read instruction from the host bus 3. It is assumed that the block number of the data area 84 is delivered from the host bus 3. At the first step 300, the microcomputer 4 fetches error information from the error information area 82. The address of the error information is obtained by a calculation based on the error information start address of the initialize information area 81 and the block number afforded by the host bus 3. By way of example, when the number of the block to be read out is "0", the address of the error information is the first address of a value "200h" which is obtained by multiplying the error information start address "0001" by 512. At the next step 301, a physical block which corresponds to the error information fetched at the step 300 is read out. When the number of the block to be read out is "0", the error information is "200h", so that data are read out of the address "4000h" of the data area 84 obtained by multiplying the value "200h" by 512. Besides, when the number of the block to be read out is "2", the error information is "100h", so that data are read out of the address "2000h" of the substitutive memory area 83. In this manner, according to this example, the error information directly expresses the physical address of the data memory 8. This example is therefore advantageous in dispensing with the error check process of the step 101 unlike the example shown in FIG. 3.

Figure 9:
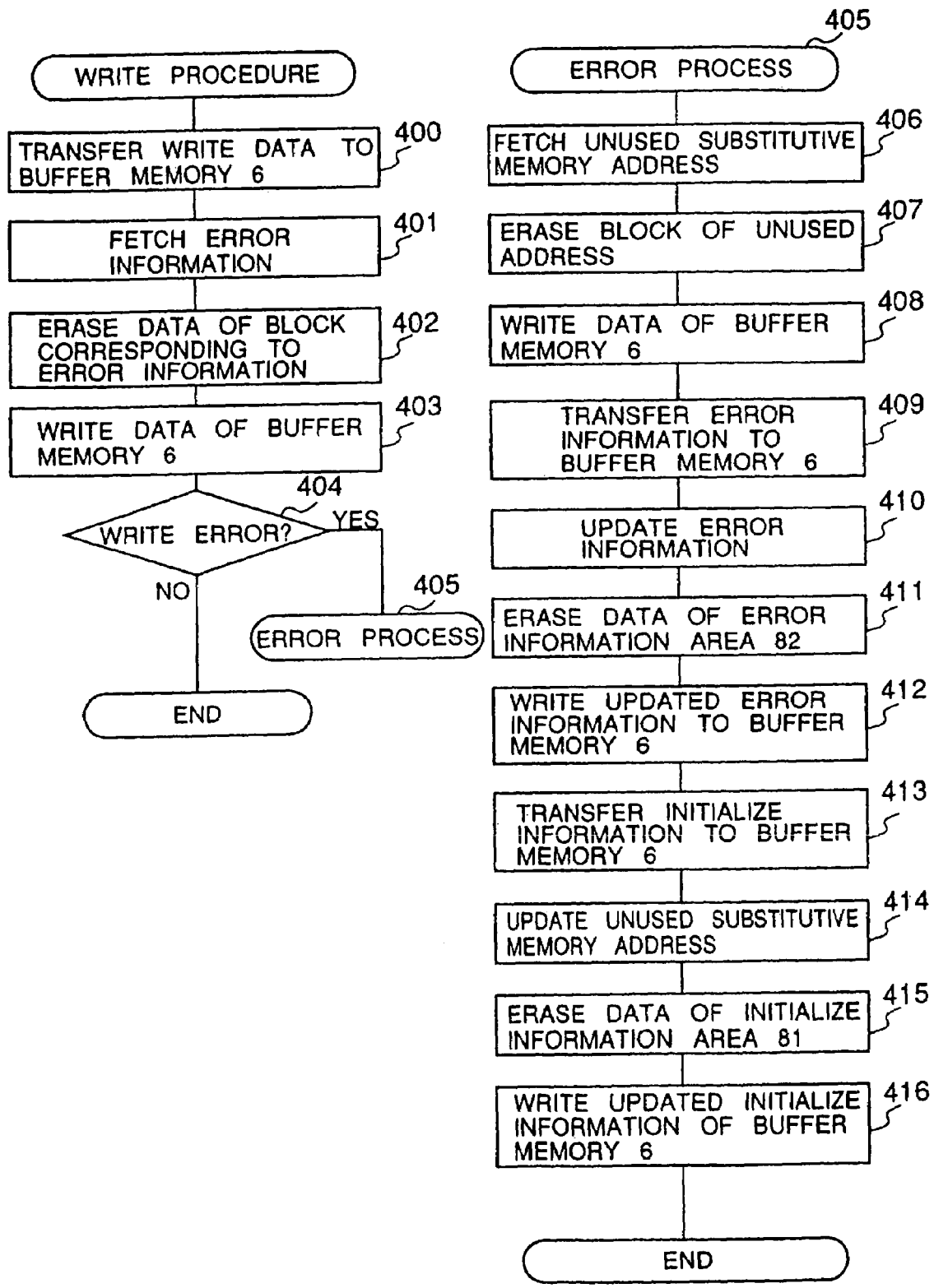
FIG. 9 is a flow chart of a write procedure which is executed by the microcomputer in the second embodiment.

Next, there will be explained a case where the semiconductor disk storage device 1 has received a write instruction from the host bus 3. FIG. 9 illustrates the processing steps of a write procedure. Data delivered from the host bus 3 are latched into the buffer memory 6 at the step 400. At the step 401, the error information of a block into which the data are to be written is fetched from the error information area 82 as in the read procedure. At the step 402, the physical address of the data writing block is calculated from the fetched error information, and the data of the block indicated by the physical address are erased. At the next step 403, the data to-be-written latched in the buffer memory 6 are written into that block of the data memory 8 which is expressed by the physical address calculated at the step 402. Subsequently, whether or not the data have been normally written at the step 403 is checked at the step 404. When the write operation is normal, the write process is ended, and when the write operation is not normal, an error process is executed at the step 405. In the error process 405, a substitutive block for the block having undergone a write error is secured so as to transfer the data to-be-written to the substitutive block, and the error information and the initialize information are updated. Referring to FIG. 9 again, the unused address of the substitutive memory area 83 is fetched from the initialize information area 81 at the step 406. The value of the unused substitutive memory address denotes the address of the new substitutive block. At the next step 407, the data of the substitutive block indicated by the unused substitutive memory address are erased. In the example of FIG. 7, the data of the block of an address "20800h" obtained by multiplying an address value "1104h" by 512 are erased. The data to-be-written latched in the buffer memory 6 are written into the block of the address "20800h" at the step 408. Subsequently, the data of the blocks of the error information having undergone the write errors are fetched from the error information area 82 and then transferred to the buffer memory 6 at the step 409. The transferred error information are updated to new error information at the step 410. The update operation is such that, regarding the error which has developed in the case of writing the data into block 10 by way of example, the error information "200h" of the block 40 is rewritten into the address information "104h" of the new substitutive block. Further, the data of the block of the error information area 82 to be rewritten are erased at the step 411, and the new error information of the buffer memory 6 is written into the block to-be-rewritten of the error information area 82 at the step 412. Besides, in order to update the address of the unused substitutive block of the initialize information area 81, the data of the initialize information area 81 are transferred to the buffer memory 6 at the step 413. Among the transferred initialize information, the unused substitutive memory address has its value incremented by one at the step 414. The resulting value serves as the address information of a new substitutive block at the next occurrence of a write error. Subsequently, the data of the initialize information area 81 are erased at the step 415, and the updated initialize information of the buffer memory 6 are written into the initialize information area 81 at the step 416. The write process including the error process is executed by the steps stated above.

Although each of the substitutive memory area 83 and the data area 84 is formed of only one area in this example, a plurality of substitutive memory areas 83 and a plurality of data areas 84 may well be provided by setting other address information and storage capacities anew in the initialize information area 81.

As thus far described, in the semiconductor disk storage device which employs the flash memory as its storage medium, the errors attributable to the limited number of rewrite operations of the flash memory can be remedied, so that the service life of the semiconductor disk storage device can be extended.

Now, there will be explained methods of determining the storage capacities of the substitutive memory areas 73, 83 and the error information areas 71, 82 in the embodiments of FIGS. 1 and 2 and FIGS. 6 and 7.

First, the storage capacity of the substitutive memory area 73 or 83 depends upon the number of those blocks in the data memory 8 which the host system 2 uses as areas to be rewritten most frequently, for example, as FAT and directory areas. Here in this example, it is assumed that a storage capacity of 128 kB is used as the FAT and directory areas in the data memory 8 of 32 MB. Herein, a storage capacity of 384 kB, triple the value 128 kB, is set for the substitutive memory area 73 or 83, even the errors of the entire FAT and directory areas can be replaced three times. Therefore, the service life of the semiconductor disk storage device 1 is quadrupled.

Thus, when the service life of the semiconductor disk storage device 1 is to be prolonged n times, the substitutive memory area 73 or 83 may be endowed with a storage capacity which is (n−1) times as large as the total storage capacity of the areas that are frequently rewritten in the data memory 8. In the case of the embodiment in FIG. 7, the substitutive memory area 83 has a storage capacity of 128 kB, and hence, the service life is doubled. In general, the FAT and directory areas are not entirely rewritten frequently, so that the service life is expected to increase still more. However, the above setting is considered to be the standard of the storage capacity of the substitutive memory area 73 or 83.

Next, the storage capacity of the error information area 71 or 82 will be studied. In the case of the embodiment in FIG. 1, an area for storing the Nos. of the respective blocks of the substitutive memory area 73 is needed in correspondence with the number of the blocks of the data memory 8. Here in this example, the substitutive memory area 73 has 768 blocks (384 kB), and the data memory 8 has 64k blocks (32 MB). Therefore, the error information area 71 requires a capacity of, at least, 80 kB for storing 10-bit address information expressive of the 768 blocks to the number of 64k.

On the other hand, in the case of the embodiment in FIG. 7, an area for storing the numbers of the blocks of the substitutive memory area 83 or the data area 84 is needed for the error information area 82 in correspondence with the number of the blocks of the data area 84. Here in this example, the substitutive memory area 83 has 256 blocks, and the data area 84 has 65024 blocks. Therefore, the error information area 82 requires a capacity for storing 16-bit information expressive of the block numbers up to the number of 65024.

The remaining storage capacity is assigned to the usage information area 72 or the initialize information area 81.

In dividing the error memory 7 or the data memory 8 into the areas as stated above, it is conveniently partitioned into block units Which are the rewriting units of the flash memory.

In this manner, according to the present invention, a storage capacity of 2% or less with respect to the full storage capacity of the flash memory is used for the error information area 71 or 82 and the substitutive memory area 73 or 83, whereby the service life of the semiconductor disk storage device 1 can be doubled or increased even more. Besides, when the service life is to be extended still more, the storage capacity of the substitutive memory area 73 or 83 may be increased, whereby the service life is prolonged to that extent.

Now, there will be explained the interface between the host system 2 and the semiconductor disk storage device 1 in the first or second embodiment. The host system 2 is an information processing equipment such as personal computer or word processor. The host bus 3 is a bus to which the host system 2 usually connects a file device such as magnetic disk storage device. In general, the host bus 3 for connecting the magnetic disk storage device is a SCSI (small computer system interface) or an IDE (Integrated drive engineering) interface. When the semiconductor disk storage device 1 of the present invention is connected to the host bus 3 of the SCSI, the IDE interface or the like similarly to the magnetic disk storage device, the conversion of the magnetic disk storage device to the semiconductor disk storage device 1 is facilitated.

In order to connect the semiconductor disk storage device 1 to the SCSI or the IDE interface, the interface thereof needs to be made the same as that of the magnetic disk storage device. To this end, first of all, the size of each block of the flash memory must be brought into correspondence with that of each sector of the magnetic disk storage device. In the foregoing embodiments, the block size is set at 512 bytes, which conforms to the sector size of the magnetic disk storage device. In a case where the block size is smaller than the sector size of the magnetic disk storage device, no problem is posed using a plurality of blocks as one sector. On the other hand, in a case where the block size is larger, one block needs to be divided into two or more sectors. In addition, regarding the tracks and headers of the magnetic disk storage device, the flash memory may be logically allotted to such tracks and headers. Besides, the interface items of the semiconductor disk storage device 1, such as control registers and interrupts, are made the same as those of the magnetic disk storage device, so as to control the semiconductor disk storage device 1 by the input/output instructions of the magnetic disk storage device delivered from the host bus 3. However, instructions peculiar to the magnetic disk storage device, for example, a process for the control of a motor, must be converted into different processes.

Table 1 below exemplifies instructions for the magnetic disk storage device, the processes of the magnetic disk storage device responsive to the instructions, and the processes of the semiconductor disk storage device 1 in the case where the instructions of the magnetic disk storage device are applied to the semiconductor disk storage device 1 as they are. In the table, a column "Semiconductor disk process" indicates the processes which are executed when the microcomputer 4 functions as the acceptance means for accepting the instructions for the semiconductor disk storage device 1 and the conversion means for converting the instructions.

TABLE 1

CONVERSION OF MAGNETIC DISK INSTRUCTIONS INTO SEMICONDUCTOR DISK INSTRUCTIONS

| No. | Instruction | Magnetic disk process | Semiconductor disk process |
|---|---|---|---|
| 1 | Recalibrate | A head is moved to cylinder #0. | No process. |
| 2 | Read Sector | Data are read from a designated sector. | A designated sector is converted into a physical address, from which data are read. |
| 3 | Write Sector | Data are written into a designated sector. | A designated sector is converted into a physical address, into which data are written. |
| 4 | Read Verify Sector | The ECC check for a designated sector is done. | No process. |
| 5 | Format Track | Headers and data fields are generated in a track, and defective sectors are detected. | A flash memory is divided into a data memory area, a substitutive memory area and an error memory area, and initial values are set in the error memory area. |
| 6 | Seek | A head is moved to a designated track. | No process. |
| 7 | Execute Drive Diagnostic | A drive is diagnosed. | The capacities etc. of the flash memory are checked. |
| 8 | Initialize Drive Parameters | Registers and internal counters are initialized. | Registers and internal counters are initialized. |
| 9 | Read Multiple Command | Data are read from a plurality of sectors. | Data are read from a plurality of sectors. |
| 10 | Write Multiple Command | Data are written into a plurality of sectors. | Data are written into a plurality of sectors. |

The examples of Table 1 are of the IDE interface. In the table, the instructions No. 1 and No. 6 are for moving the head. Herein, since the semiconductor disk storage device 1 has no head, no process is executed in response to the instruction No. 1 or No. 6. Moreover, the flash memory need not have any ECC (error correction code) set because the error rate thereof is much lower than that of the magnetic disk storage device. Therefore, the semiconductor disk storage device 1 executes no process in response to the instruction "Read Verify Sector". The other instructions are as listed in Table 1.

Incidentally, even in the case of no process indicated in Table 1, when an interrupt or the like is issued in the magnetic disk storage device, an interrupt is similarly issued in the semiconductor disk storage device 1. That is, the interface is established so that the magnetic disk storage device and the semiconductor disk storage device 1 may not be distinguished as viewed from the host bus 3.

As thus far described, the interface of the semiconductor disk storage device 1 is made the same as that of the magnetic disk storage device, whereby the replacement of the magnetic disk storage device with the semiconductor disk storage device 1 is facilitated Regarding the SCSI interface of the semiconductor disk storage device 1, the replacement can be easily done by establishing the same interface as that of the magnetic disk storage device as in the case-of the IDE interface. Since, however, devices other than the magnetic disk storage device, such as a magnetooptic disk storage device, can be connected to the SCSI interface, the file device has an individual instruction system, Accordingly, the semiconductor disk storage device 1 can also eliminate useless processes and raise its operating speed when a dedicated instruction system is set therefor. Basically, however, the instruction system of the semiconductor disk storage device 1 is the same as that of the magnetic disk storage device, without a motor control command etc. In this case, the block size of the flash memory may be as desired, and one block of the flash memory may be processed as one sector. Besides, the processes of the microcomputer 4 and the processes of the flow charts of FIGS. 3, 4 and 5 or FIGS. 8 and 9 as explained in the embodiment of FIG. 1 or FIG. 6 may well be executed by the host system 2.

Meanwhile, the specifications of JEIDA (Japan Electronic Industry Development Association) and PCMCIA. (Personal Computer Memory Card International Association) are known as the standard specifications of IC card interfaces. The semiconductor disk storage device 1 of the present invention may well be constructed in the form of an IC card with its interface conformed to the JEIDA or PCMCIA specifications. In this case, the semiconductor disk storage device 1 is dealt with as an I/O device.

The advantages of the semiconductor disk storage device 1 over the magnetic disk storage device are as follows: Since the semiconductor disk storage device 1 suffices with a smaller number of processes than the magnetic disk storage device as indicated in Table 1, it can be operated at a higher speed. In addition, since the semiconductor disk storage device 1 does not include mechanical parts such as a motor, the power consumption thereof is lower. Besides, the semiconductor disk storage device 1 exhibits a resistance to impacts concerning vibrations etc. Moreover, owing to a high reliability, the semiconductor disk storage device 1 does not require any ECC.

The use of the flash memory as the storage medium is based on the following advantages: Since the flash memory is nonvolatile, it holds data even when the power supply is turned off, and it need not be backed up by a battery unlike an SRAM or DRAM. Further, since the flash memory is structurally simple compared with an EEPROM, it can have its storage capacity easily enlarged, and it is suited to mass production and can be fabricated inexpensively.

In the present invention, the flash memory of a storage device may well be divided into a plurality of areas including a plurality of data memory areas which store data therein and which are provided in correspondence with the divisional areas, a plurality of substitutive memory areas which substitute for the data memory areas having undergone errors and which are provided in correspondence with the divisional areas, a plurality of error memory areas which store the error information of the data memory areas therein and which are provided in correspondence with the divisional areas, and an initialize information area which stores the start addresses and storage capacities of the three sorts of memory areas therein. According to this expedient, in a case where the data storing capacity of the storage device is to be enlarged by additionally providing one or more flash memory elements, it can be enlarged by adding the three sorts of memory areas anew, without altering the contents of the error memory areas and the data memory areas stored before. The information of the added flash memory element or elements may be stored in the initialize information area.

Besides, in the present invention, the error memory areas may well also retain the error information of the substitutive memory areas having undergone errors. This expedient makes it possible to remedy, not only the errors of the data memory areas, but also the errors which have developed in the substitutive memory areas having once substituted for the data memory areas. The substitutive memory areas having undergone the errors may be replaced in the same manner as in the case where the errors have developed in the data memory areas. The replacements of the substitutive memory areas can extend the service life of the storage device.

Further, in the present invention, the storage capacity of the substitutive memory areas may be afforded by predetermined ones of the data memory areas. As the predetermined areas, areas which are rewritten most frequently may be selected. Then, the service life of the storage device can be rendered much longer with a small number of substitutive areas.

As set forth above, the present invention has the effect that the service life of a semiconductor disk storage device employing a flash memory as its storage medium can be extended.

Figure 10:
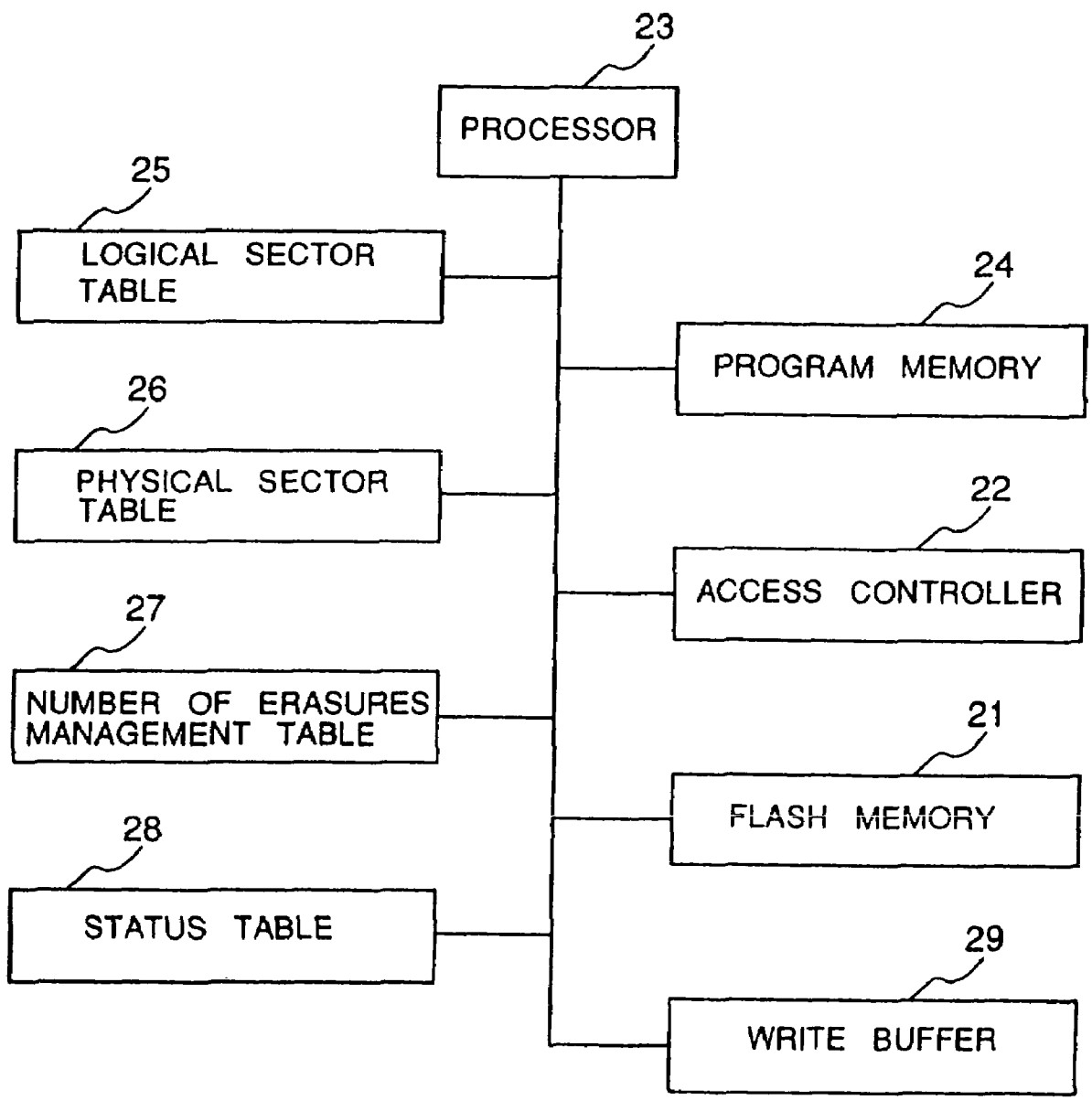
FIG. 10 is a diagram showing the hardware architecture of the third embodiment of the present invention.
Figure 11:
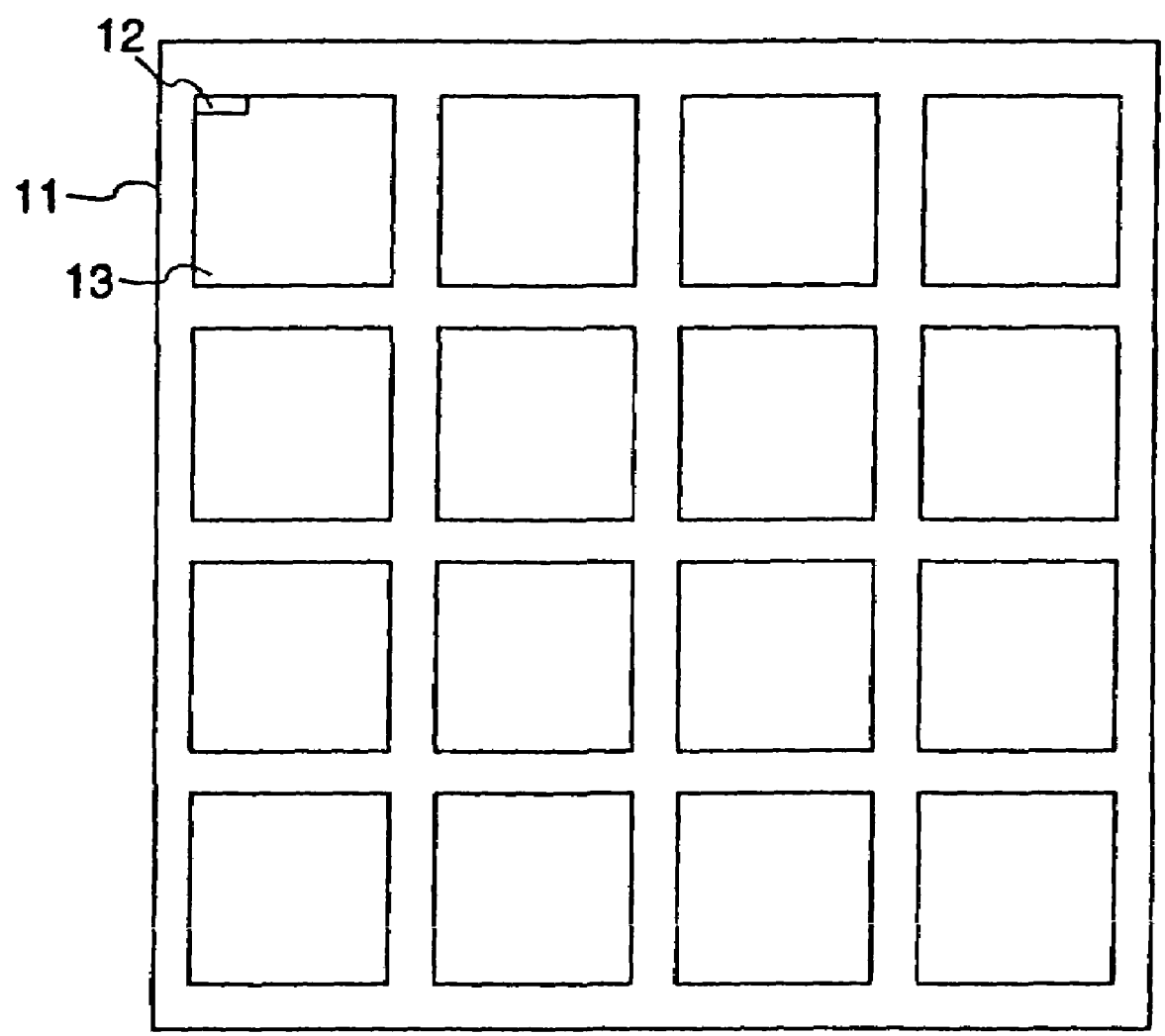
FIG. 11 is a diagram showing the storage configuration of a flash memory chip which is included in the third embodiment.
Figure 12:
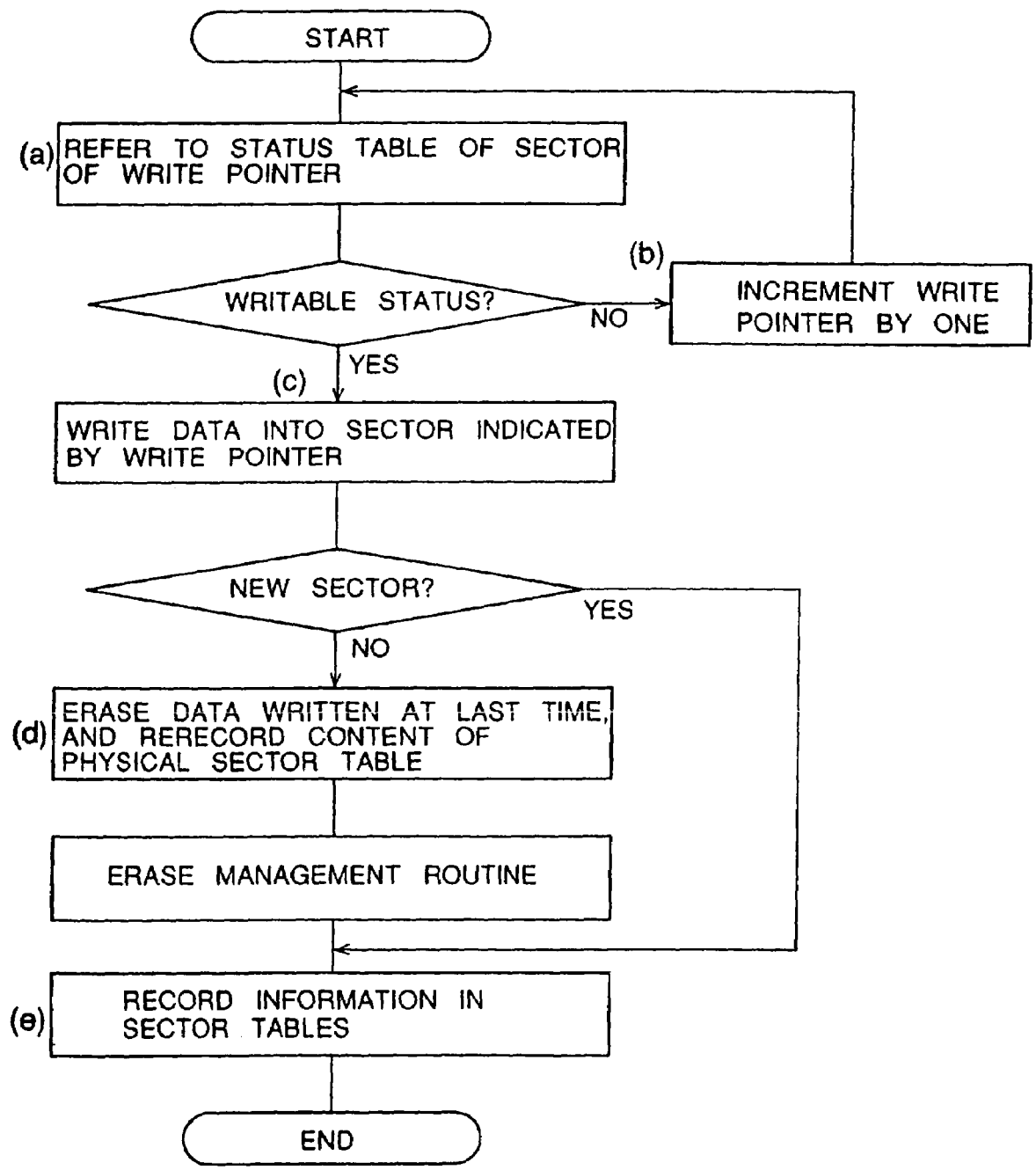
FIG. 12 is a flow chart of a main routine showing the operation of the third embodiment.
Figure 13:
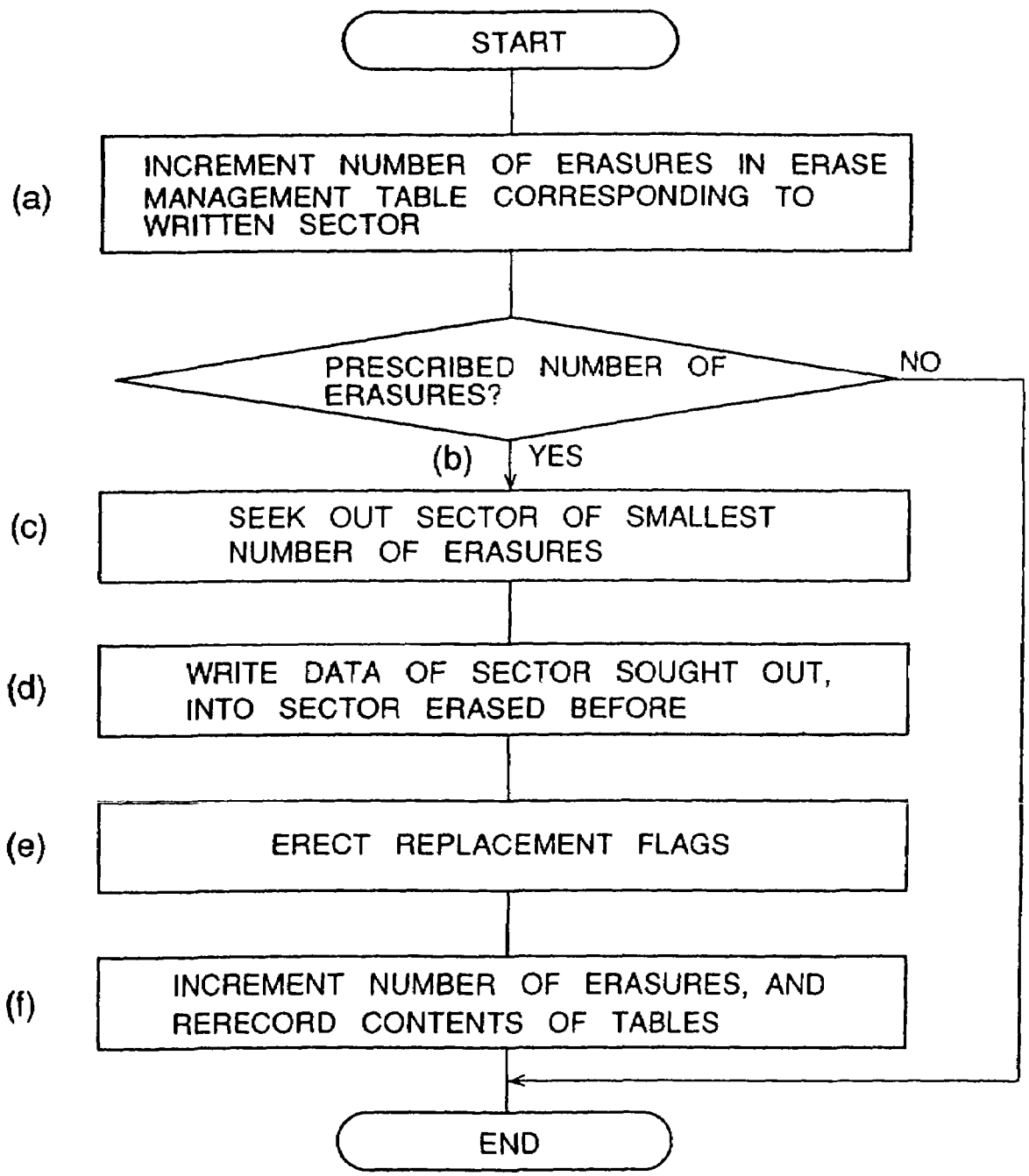
FIG. 13 is a flow chart of an erase management routine showing the erase management operation of the third embodiment.

Now, the third embodiment of the present invention will be described with reference to FIGS. 10, 11, 12 and 13. FIG. 10 is a diagram of the hardware architecture for realizing the third embodiment, FIG. 11 is a diagram showing the internal configuration of a flash memory chip for use in this embodiment, FIG. 12 is a flow chart of the main routine of stored data management, and FIG. 13 is a flow chart of an erase management routine.

First, the operation of a flash memory will be explained with reference to FIG. 11. In the figure, numeral 11 denotes the entire memory chip, numeral 12 a data reading unit, and numeral 13 the smallest unit of a data erasing operation, which shall be called the "erase block". The flash memory is a sort of EEPROM which is an electrically erasable PROM. However, whereas the ordinary EEPROM has a data reading unit and a data erasing (rewriting) unit which are equal in size, the flash memory has the data erasing unit which is much larger than the data reading unit. In the flash memory, accordingly, the operation of rewriting data once written is inevitably attended with erasing a large number of other data at the same time. As an alternative advantage, however, the flash memory can be manufactured at a density of integration higher than that of the ordinary EEPROM, so that it is well suited to a large capacity storage device. Referring to FIG. 11, the entire memory chip 11 is divided into two or more erase blocks 13. Whereas the reading unit 12 is one word (the "word" is the word of the memory conforming to the construction of this memory), each of the erase blocks 13 is an area larger than the reading unit 12. In the case of applying the flash memory to an auxiliary storage, it is easily handled when the erasing unit is set at 512 bytes in conformity with the specifications of a magnetic disk storage device.

Next, the system architecture and operation of the third embodiment of the storage device employing the flash memory will be explained with reference to FIGS. 10, 12 and 13. In the ensuing description, the storing unit of file data shall be called a "sector", and one sector shall be in agreement with one erase block in this embodiment. In FIG. 10, numeral 21 denotes flash memory chips in which the file data are stored. An access controller (memory controller) 22 generates access signals which are directed to the flash memory 21. A processor 23 deals with stored data and status data, and constructs an external storage system based on the flash memory 21. A program memory 24 stores therein control programs for operating the processor 23. A logical sector table (logical sector reference means) 25 is for referring to the location of the flash memory 21 at which the data of a sector (logical sector) indicated by a certain logical address (logical sector identification information) is mapped, while a physical sector table (physical sector reference means) 26 is for referring to the logical sector No. of the file data which is mapped at a physical sector indicated by the physical address (physical sector identification information) of the flash memory 21. A number of erasures management table (number of erasures reference means), 27 registers the cumulative numbers of erasures of a respective physical addresses. A status table (status reference means) 28 is for referring to the statuses of the respective physical sectors. A write buffer 29 serves to temporarily store data to-be-written therein, for the purpose of quickening the operation of writing the data. The processor 23 runs the programs stored in the program memory 24, to thereby function as logical sector conversion means, number of erasures management means and control means. Also, it retains sector pointers.

In operation, when an access request for reading data is received from a system (client system) which issues access requests to the system of this embodiment, the processor 23 refers to the logical sector table 25 to deduce a physical sector in which the data of a pertinent logical sector is stored. Subsequently, the processor 23 accesses the physical sector and transmits the requested data to the client system.

The processing of the processor 23 which complies with a request for writing data as received from the client system, will be explained with reference to the flow chart of FIG. 12. This flow chart in FIG. 12 shows the main routine of the programs stored in the program memory 24. The processor 23 has a write pointer (sector pointer) set for pointing to a sector into which the next data is to be written, and it checks if the sector pointed at by the pointer has a writable status, with reference to the status table 28 (step (a)) The status table 28 contains a flag which indicates that the sector has degraded and is unusable due to a large number of erasures, and a flag which indicates that data has already been written into the sector. When the flag is raised to indicate the unwritable status of the sector, the pointer is shifted to the next sector (step (b)) Incidentally, the steps (a) and (b) correspond to the logical sector conversion means of the processor 23. On the other hand, when the sector is writable, the data is written into the sector (step (c)). Herein, in a case where the write operation is to rewrite a logical sector into a new sector into which data has never been written, the data of the logical sector written before is no longer necessary. Therefore, a physical sector in which the unnecessary data is written is sought in view of the logical sector table 25, so as to erase the data, while at the same time, the content of the physical sector table 26 recorded in the last write operation is erased (step (d)). After the sector has been erased, the main routine jumps to an erase management routine. This erase management routine (number of erasures management means) will be explained later. Further, a physical sector number indicated by the write pointer is recorded in the logical sector table 25, and a logical sector number written into a location indicated by the write pointer is recorded in the physical sector table 26 (step (e)).

Incidentally, at the step (a), the decision on the status of the sector may well be recorded in the status table 28. The status of the sector can also be decided in view of the physical sector table 26. This status can be easily checked in such a way that all bits are set at H (high level) or L (low level) for an unwritten sector in the physical sector table 26.

Next, the erase management routine mentioned above will be explained with reference to FIG. 13. The number of erasures counter of the erase management table 27 corresponding to the physical sector from which the data has been erased, is incremented by one (step (a)). If the number of erasures has not reached the prescribed number of times of the flash memory, the erase management routine returns to the main routine, and if it has reached the prescribed number of times, data is replaced (step (b)). In order to replace the data, all the other sectors of the number of erasures management table 27 are examined to seek out the sector which has the smallest number of erasures and whose data has not been replaced (step (c)). The data which is stored in the sought sector exhibiting the smallest number of erasures is written into the sector raised before (step (d)). After the data has been written, the replacement flags of both the sectors are erected in the status table 28 (step (e)). The replacement flags are set for the following reason: The physical sector which exhibits a smaller number of erasures comes to be erased more frequently by the erase management routine. Nevertheless, if no means is provided for indicating the replacement, the physical sector will be selected as the object of the replacement on account of the smaller number of erasures. Then, the numbers of erasures cannot be uniformalized for all the sectors. Besides, even the sector which has a large number of erasures and into which the data is written on this occasion might be frequently erased without the means for indicating the replacement. The replacement flags prevent such situations from occurring. After the replacement flags have been raised, the corresponding contents of the logical sector table 25 and the physical sector table 26 are rerecorded (step (f)).

Thereafter, the erase management routine returns to the main routine. Incidentally, the sector selected as having the smallest number of erasures is erased once more, so that the corresponding number of erasures counter of the erase management table 27 needs to be incremented.

In addition, when the replacement flags of all the sectors have been raised, they are cleared. Alternatively, the logical decision levels of the replacement flags are inverted. That is, the replacements having been decided with the level "1" shall be decided with the level "0" thenceforth.

Besides, the prescribed number of erasures at the step (b) in FIG. 13 ought to be the multiple of a value which is smaller than the guaranteed value of the rewritable number of erasures of the flash memory. For example, when the guaranteed number of erasures is 10000, a suitable prescribed number of erasures is the multiple of 1000 or that of 2000 or 5000.

Owing to the erase management routine, when the data of limited blocks have been frequently erased, they are replaced with the data of blocks exhibiting smaller numbers of erasures, whereby the data of the sectors erased less frequently are stored in the blocks exhibiting larger numbers of erasure's, so that the numbers of erasures can be uniformalized. This expedient is considered very effective for the stored data of ordinary auxiliary storages. By way of example, although data are not rewritten at all in an area in which an operation system program is stored, data are frequently rewritten in areas in which the graphic data and text data to serve as the data of application programs are stored. Therefore, unless the numbers of erasures are uniformalized, the memory of the system program area does not degrade at all due to an incremented number of erasures because no data changes, whereas the memories of the other data areas are frequently erased in limited memory spaces and rapidly increase the numbers of erasures. Thus, it can be said that the erase management routine is especially effective when the number of the usable areas is small.

The third embodiment operates as stated above. This embodiment brings forth the following effects: Since the processor 23 is mounted, fine controls can be performed in accordance with the contents of the program memory 24. Moreover, the speed of a data writing operation is heightened owing to the write buffer 29, and the recording of the statuses of individual sectors is extended owing to the status table 28. Besides, since the service life of the flash memory is prolonged, the optimum file administration in which the numbers of erasures are managed is realized.

Figure 14:
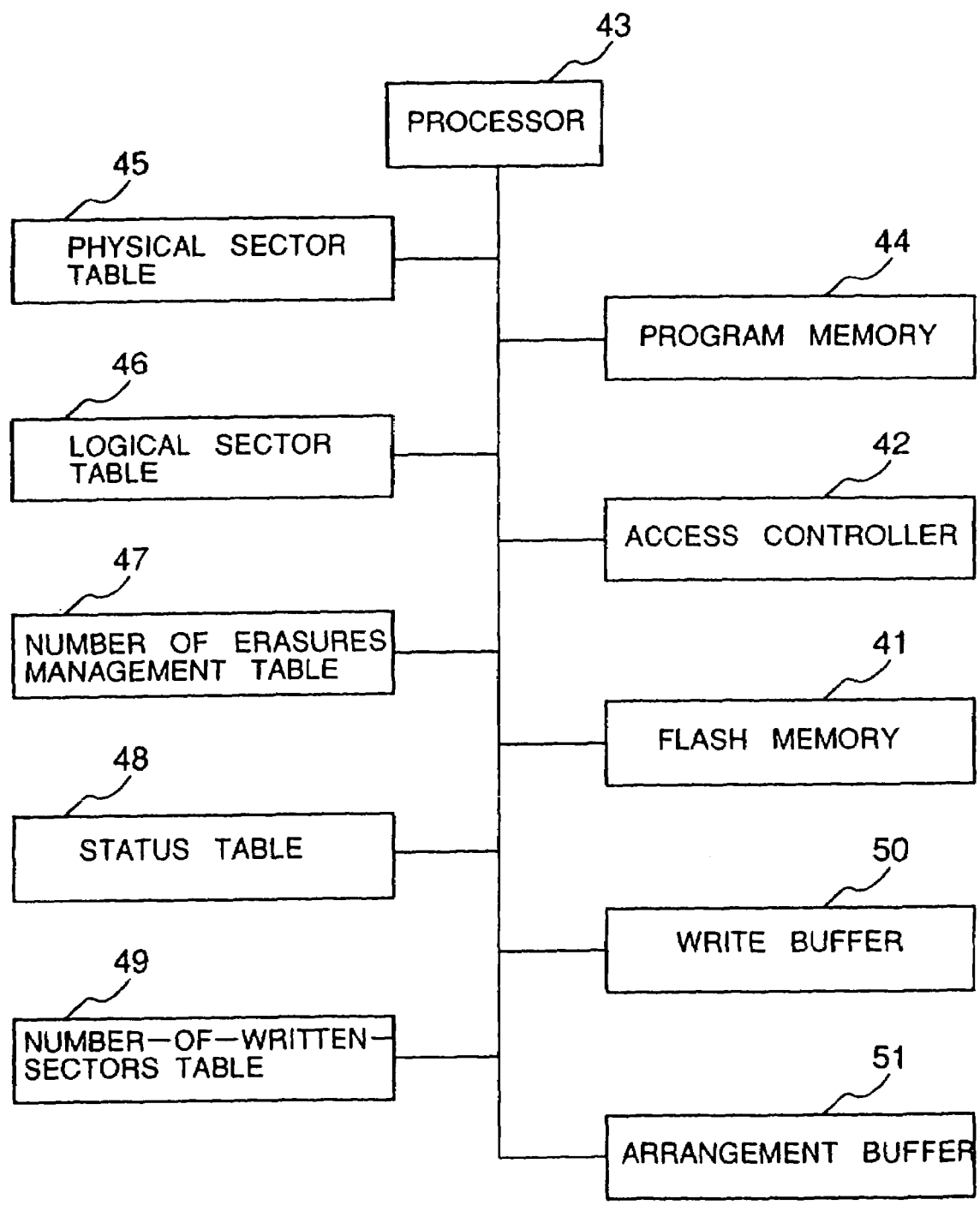
FIG. 14 is a diagram showing the hardware architecture of the fourth embodiment of the present invention.
Figure 15:
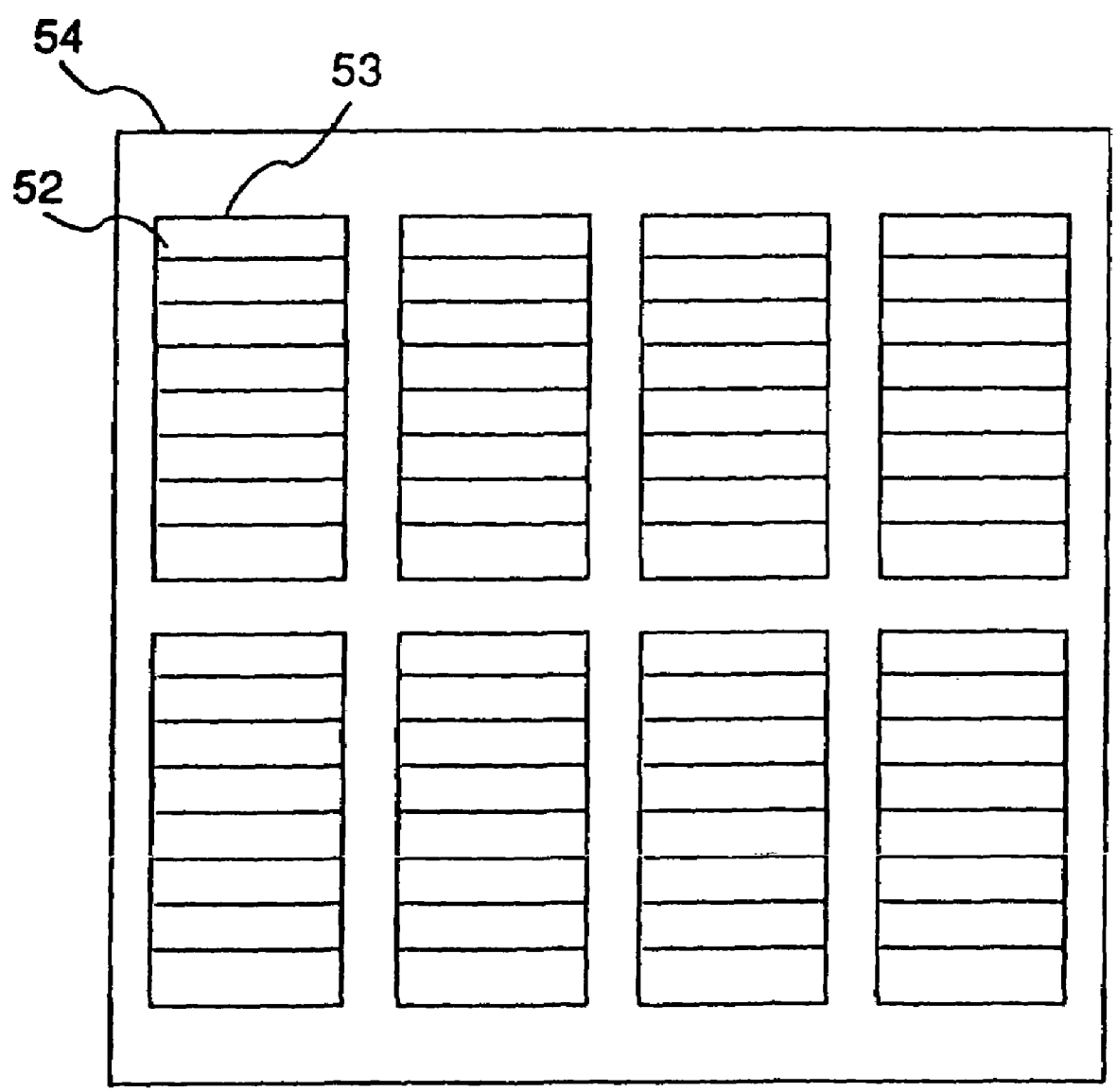
FIG. 15 is a diagram showing the storage configuration of a flash memory chip which is included in the fourth embodiment.
Figure 16:
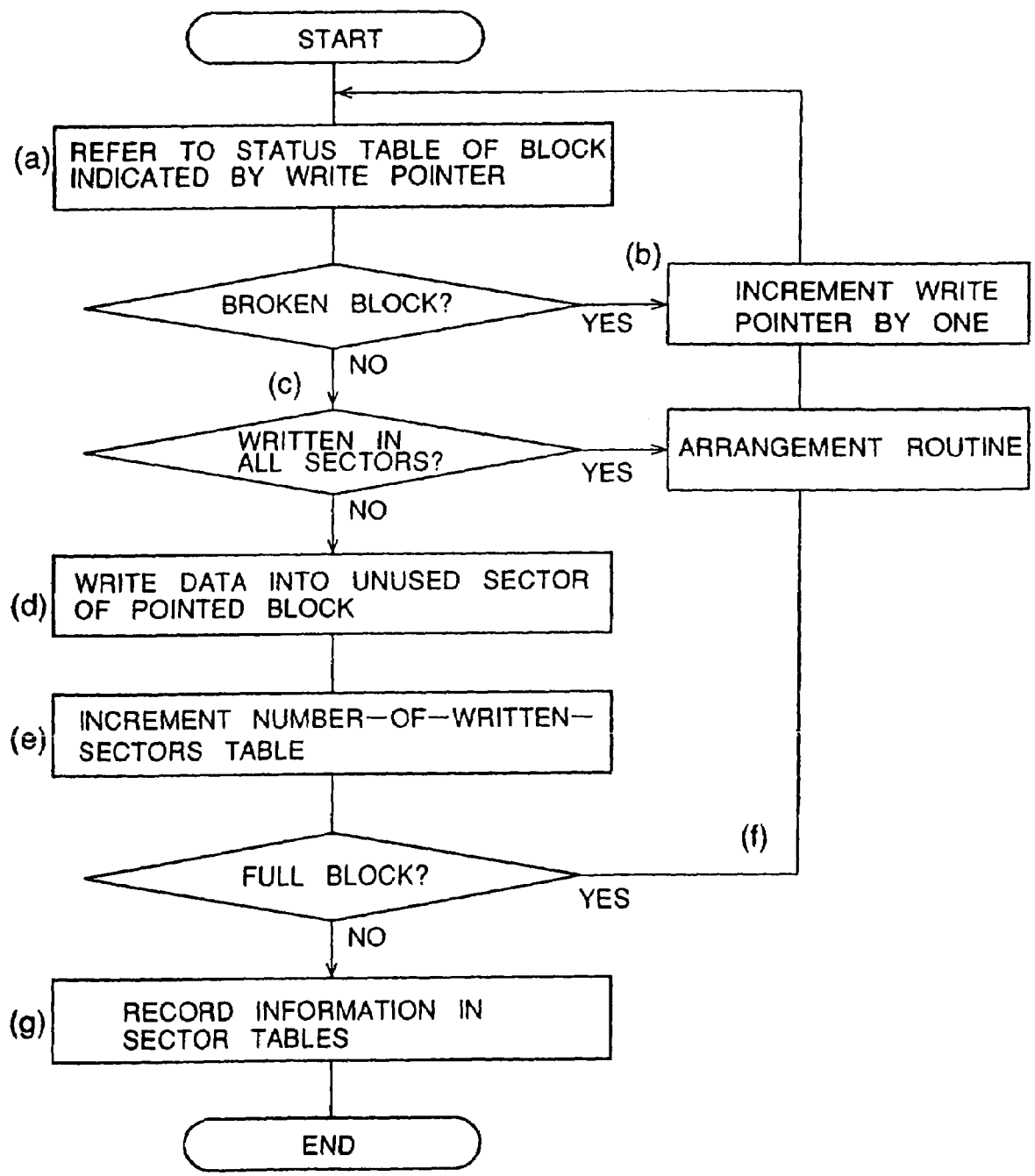
FIG. 16 is a flow chart of a main routine showing the operation of the fourth embodiment.
Figure 17:
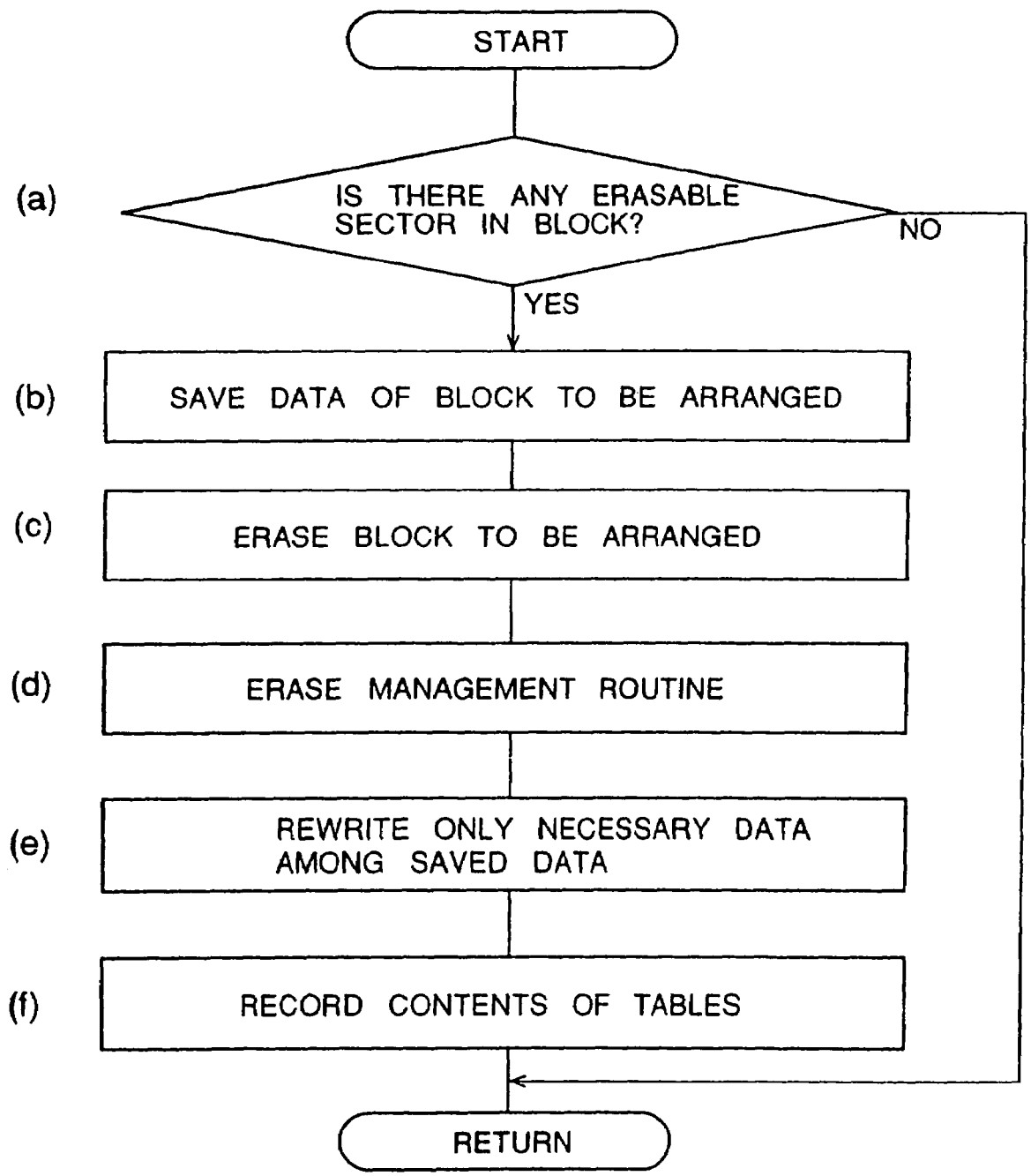
FIG. 17 is a flow chart of an arrangement routine showing the sector arrangement operation of the fourth embodiment.
Figure 18:
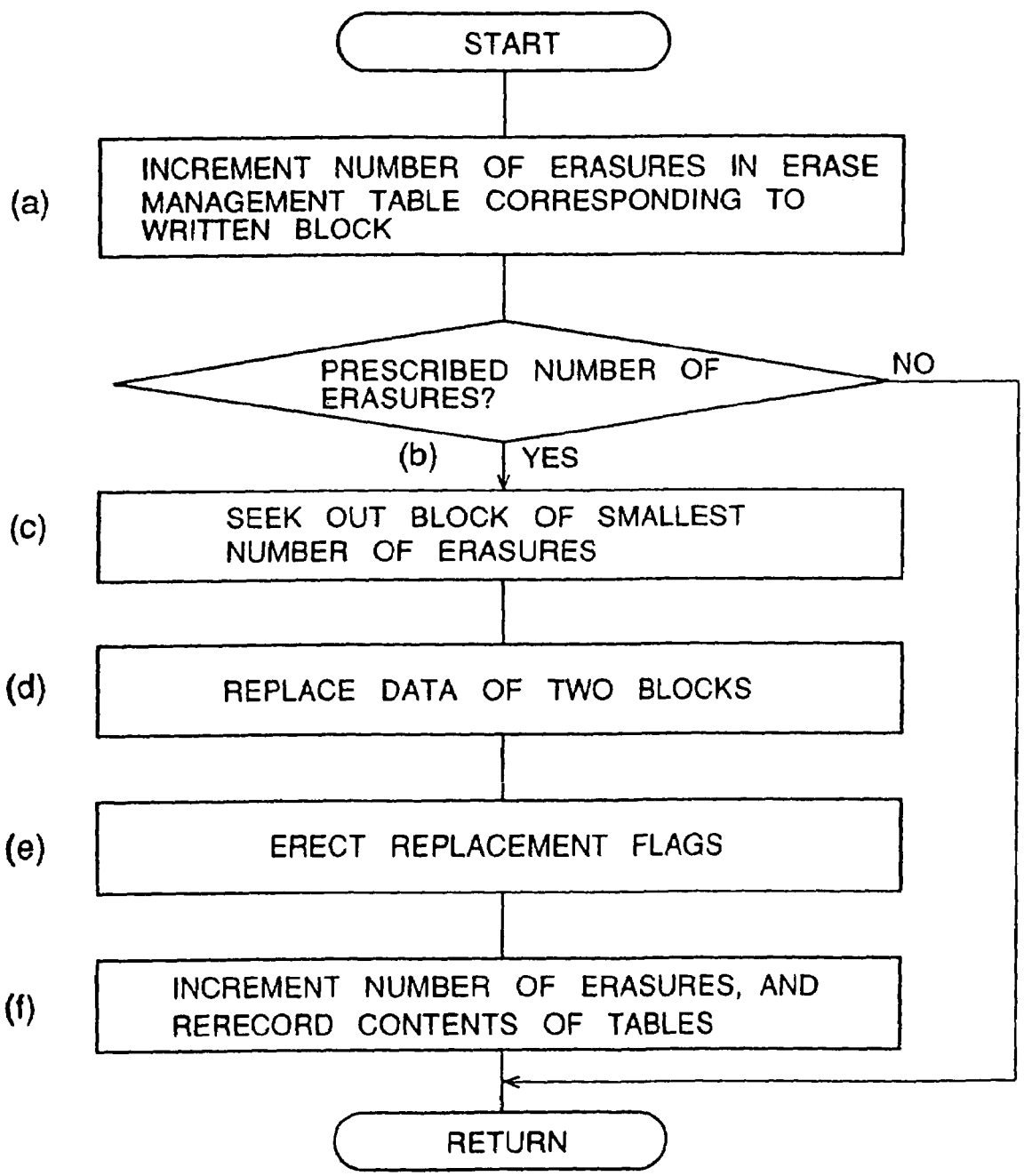
FIG. 18 is a flow chart of an erase management routine showing the erase management operation of the fourth embodiment.

Now, the fourth embodiment of the present invention will be described with reference to FIGS. 14, 15, 16, 17 and 18. FIG. 14 is a diagram showing the hardware architecture of the fourth embodiment, FIG. 15 is a diagram showing the internal storage configuration of a flash memory in this embodiment, FIG. 16 is a flow chart of a main routine which functions to write data, FIG. 17 is a flow chart of an arrangement routine by which a sector storing unnecessary data therein is turned into an unwritten sector, and FIG. 18 is a flow chart of an erase management routine which manages the numbers of erase operations.

First, the chip of the flash memory in this embodiment and a method of using this chip will be explained in conjunction with FIG. 15. In the figure, numeral 52 indicates the unit of a storage area for storing file data, the unit being the "sector" termed in the third embodiment. Numeral 53 indicates the smallest unit of a data erasing operation, which is called an "erase block" and which is constituted by a plurality of sectors 52. That is, the storage capacities of the erase block 53 and the sector 52 are unequal herein unlike those of the third embodiment. Shown at numeral 54 is the entire memory chip. Although the memory chip 54 is constituted by a plurality of erase blocks 53 in the illustration, a chip constructed of one erase block is also considered.

This embodiment is applied to the memory chip in which the file data are stored in sector unit, but in compliance with a request for rewriting the file data of a certain sector 52, also the other sectors of the erase block 53 are simultaneously erased.

Referring to FIG. 14 illustrative of the hardware architecture of this embodiment, numeral 41 indicates the flash memory which forms storage areas for data to-be-written and which is constructed of a plurality of memory chips 54. An access controller 42 accesses the flash memory 41, a processor 43 deals with stored data and status data, and a program memory 44 stores therein control programs for actuating the processor 43. A physical sector table 45 is used for referring to logical sector Nos. stored in the corresponding physical sectors 52 of the flash memory 41, while a logical sector table 46 records physical sector numbers therein for the purpose of referring to those physical sectors of the flash memory 41 in which the data of the stored logical sector numbers are respectively stored. Numeral 47 denotes an erase management table in which the numbers or erasures of the individual blocks are recorded, numeral 48 denotes a status table in which the statuses of the individual blocks are recorded, and numeral 49 denotes a number-of-written-sectors table which is used for referring to the numbers of sectors in which data are already written. A write buffer (second storage means) 50 serves to temporarily hold the data to-be-written in order to heighten the speed of a data writing operation, while an arrangement buffer (first storage means) 51 which is used when the arrangement routine in FIG. 17 is executed.

The operation of the fourth embodiment will be explained below. A read access is processed by referring to the logical sector table 96 and the physical sector table 45 in the same manner as in the third embodiment.

On the other hand, a write access is processed as illustrated in FIG. 16. First, a write pointer is set, and the status of a block pointed to by the write pointer is checked by referring to the status table 48 (step (a)). The write pointer in this embodiment is a pointer set in block units. When the block is broken, the pointer is shifted to the next block (step (b)). When the checked block is not broken, the number of written sectors of the block is checked by referring to the number-of-written-sectors table 49 (step (c)) Herein, when data are already written in all the sectors of the checked block, the main routine jumps to the arrangement routine. This arrangement routine will be explained later. On the other hand, when the checked block has any unused sector, data is written into the sector (step (d)), and the corresponding number of written sectors is incremented by one in the number-of-written-sectors table 49 (step (e)). Thus, by way of example, in a case where data was written into the third physical sector of the first block by the last write operation as viewed in FIG. 15, data is written into the fourth physical sector of the first block by the next write operation. An actual write access control is performed by the access controller 42. In due course, data are written into all the sectors of the pertinent block. Then, the main routine jumps to the arrangement routine (step (f)). Insofar as the pertinent block is not full, the sector numbers stored in the physical sector table 45 and the logical sector table 46 are respectively rerecorded after the write operation (step (9)). Herein, when the write operation is to rewrite the data of the logical sector written before, the logical sector numbers recorded in the physical sector table 45 before is erased. This operation of erasing the logical sector number serves to indicate that the data of the corresponding physical sector is invalid.

Next, the arrangement routine will be explained. This routine is an operation routine which is executed when the block pointed to by the write pointer has had the data already written into all its sectors and is therefore unwritable. The reason why the arrangement routine is required, is as follows: According to the data writing method explained above, the data of the same file to be rewritten is written into a physical sector different from the physical sector in which the data is stored. That is, the stored data becomes unnecessary before being rewritten, but it is kept stored in the memory and is to be erased. However, in a case where the data is erased each time it becomes unnecessary, the flash memory which has a limited in the number of erase operations would have its service life shortened. Therefore, the arrangement routine is required. This arrangement routine is executed when the block has become full of the written data.

A concrete method of arrangement proceeds in accordance with the flow chart of FIG. 17. As illustrated in the figure, the physical sector table 45 is first referred to, to check if the block to be arranged includes an erasable sector, namely, an unnecessary sector whose data is to be rewritten into another physical sector anew (step (a)). Subsequently, when no erasable sector exists, the arrangement routine returns to the main routine. In contrast, when any erasable sector exists, the block is re-arranged. On this occasion, data stored in the block to be re-arranged are saved in the arrangement buffer 51 (step (b)), and the block to be re-arranged is erased (step (c)). After the block has been erased, the arrangement routine jumps to the erase management routine illustrated in FIG. 18 (step (d)). The erase management routine will be explained later. At the next step, only necessary sectors among the sectors of the block to-be-arranged latched in the arrangement-buffer 51 are re-written in this block (step (e)). In this regard, with the first scheme in which the necessary sectors are re-written in their original locations, the contents of the logical sector table 46 and the physical sector table 45 need not be rerecorded. On the other hand, with the second scheme in which the necessary sectors of younger sectors Nos. in the block are re-written earlier, data can be easily written into the next new sector. The first or second scheme is selected as occasion arises. In the case of the second scheme, the contents of the logical sector table 46 and the physical sector table 45 need to be rerecorded. With either of the first and second schemes, the number of the re-written sectors needs to be recorded anew in the number-of-written-sectors table 49 (step (f)).

Next, the erase management routine will be explained in conjunction with the flow chart shown in FIG. 18. Although the erase management routine is basically the same as that of the third embodiment, the former differs from the latter in that erase operations are managed in block units, not in sector units. First, the number of erasures in the erase management table 47 corresponding to the written block is incremented (step (a)). Whether or not the number of erasures of the erased block has reached a predetermined number, is subsequently checked (step (b)). When the predetermined number has been reached, the erase management routine is quit. On the other hand, when the predetermined number has not been reached, the numbers of erasures of all the blocks 53 of the flash memory chip 54 are checked so as to seek out the block exhibiting the smallest number of erasures (step (c)). Herein, when the block of the smallest number of erasures does not agree with the arranged block, the data of the two blocks are replaced with each other (step (d)). The arrangement data buffer 51 shown in FIG. 14 is utilized for the replacement. Subsequently, the replacement flags of the blocks whose data have been replaced are raised (step (e)). Further, the number of erasures counter of the erase management table 47 corresponding to the erased block is incremented, and the contents of the logical sector table 46 and the physical sector table 45 are rerecorded (step (f)). The above is the operation of the erase management routine in this embodiment.

Owing to the erase management routine, in the same manner as in the third embodiment, when the data of limited blocks have been frequently erased, they are replaced with the data of blocks exhibiting smaller numbers of erasures, whereby the numbers of erasures of the blocks can be uniformalized.

The fourth embodiment is operated as explained above. This embodiment brings forth the effect that, when the erase block is too large as the unit of the data writing sector, it can be divided and used efficiently.

Incidentally, although the write buffer and the arrangement buffer are separate in the illustrated embodiment, they may well be identical.

Figure 19:
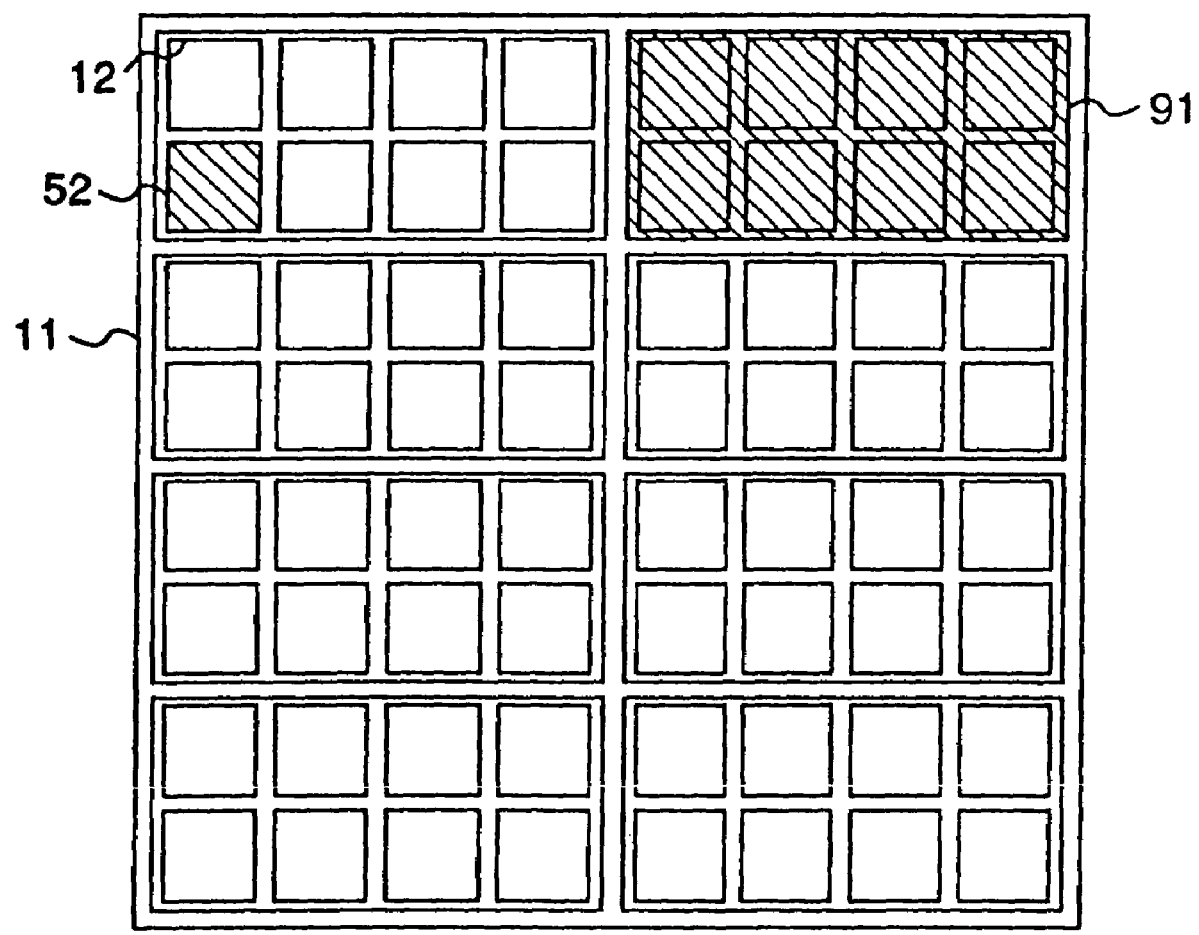
FIG. 19 is a diagram showing the storage configuration of a flash memory chip which is included in the fifth embodiment of the present invention.

Now, the fifth embodiment of the present invention will be described with reference to FIGS. 19, 20 and 21. In this embodiment, a memory chip has an erase block and a sector of equal storage capacities as in the third embodiment, but it is used in a configuration illustrated in FIG. 19. In the figure, numeral 91 indicates a superblock which is constituted by a plurality of sectors. Since the units of the sector and the erase block have equal sizes in this embodiment, the superblock 91 in this embodiment is constituted by a plurality of erase blocks. As in FIG. 11 or FIG. 15, numeral 11 denotes the entire memory chip, numeral 12 a data reading unit, and numeral 52 the sector.

Figure 20:
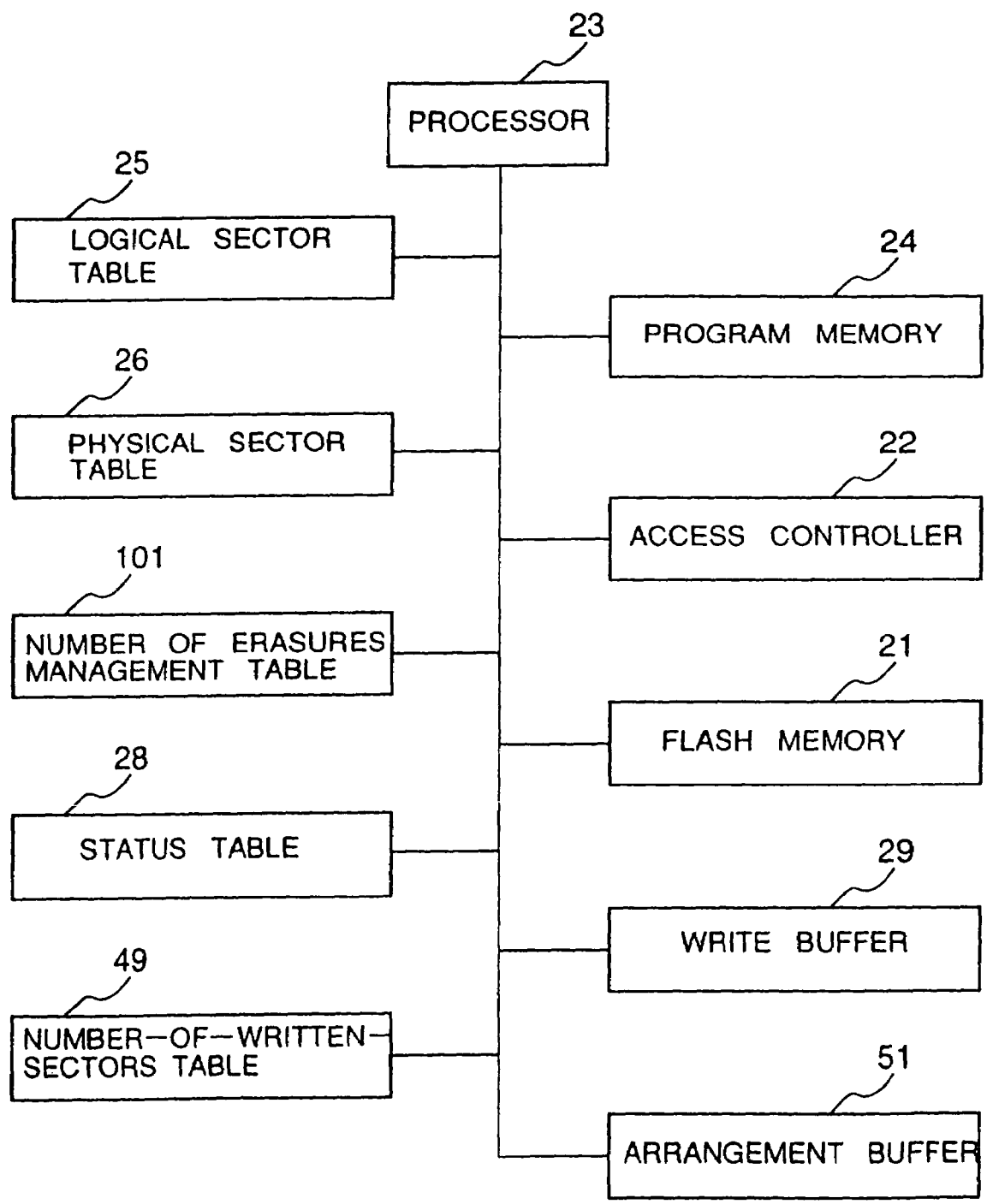
FIG. 20 is a diagram showing the hardware architecture of the fifth embodiment.

The hardware architecture of the fourth embodiment is as illustrated in FIG. 20. In the figure, numeral 101 denotes an erase management table in which the number of erasures of the respective superblocks 91 are recorded. As will be detailed later, it turns out that the cumulative number of erasures in the superblocks 91 are stored in the erase management table 101. The other constituents of this embodiment in FIG. 20 correspond to those denoted by the similar numerals in FIG. 10 or FIG. 14, respectively.

Figure 21:
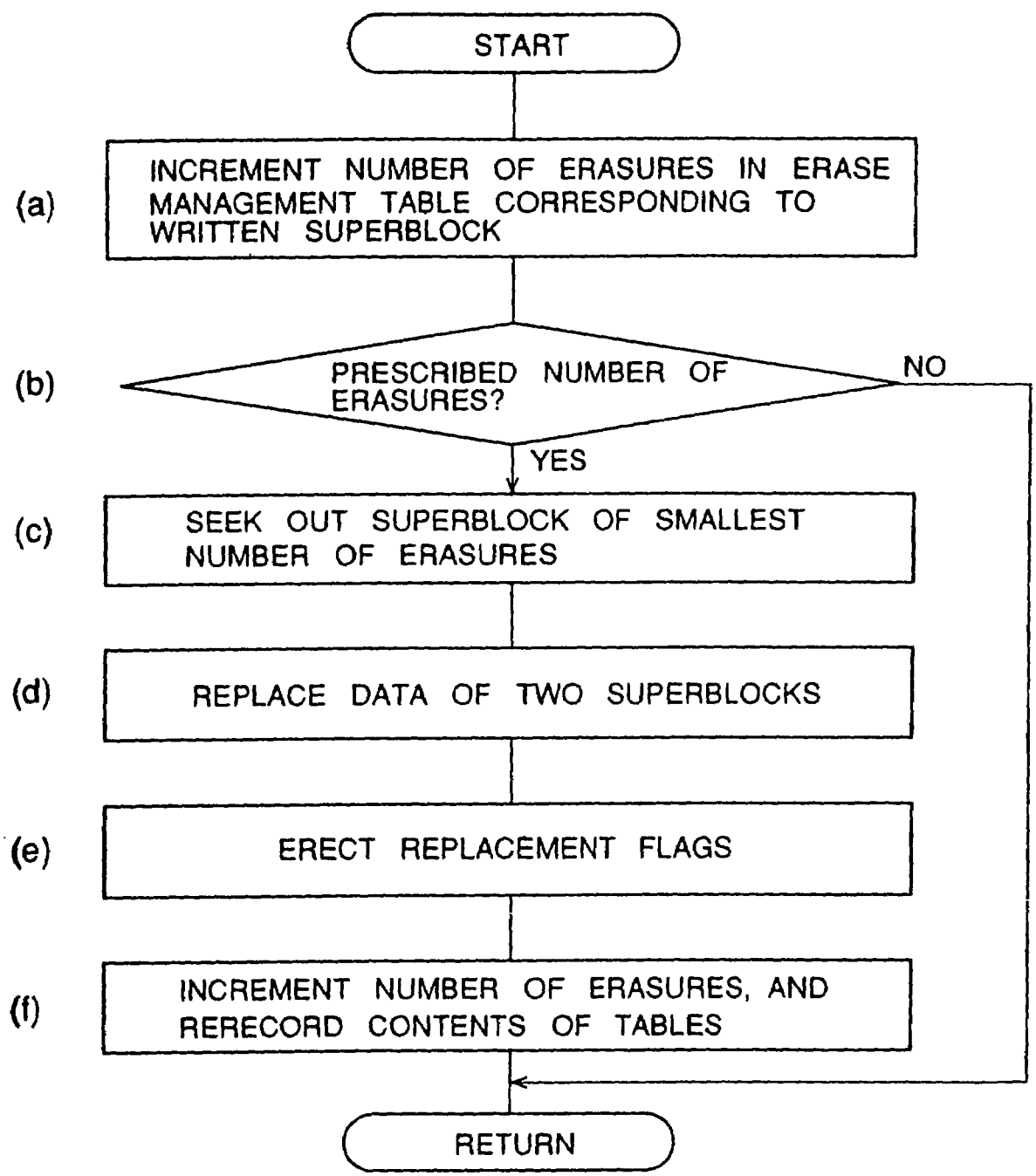
FIG. 21 is a flow chart of an erase management routine showing the erase management operation of the fifth embodiment.

FIG. 21 is a flow chart of an erase management routine in this embodiment. The main routine of this embodiment is similar to that of the third embodiment shown in FIG. 12. It is assumed that the processing of the main routine shall proceed as explained in connection with the third embodiment, and the operation of this embodiment after the jump of the main routine to the erase management routine will be explained with reference to FIG. 21.

The number of erasures counter of the erase management table 101 corresponding to the superblock 91 in which an erased sector is included, is incremented at the first step (step (a)). Whether or not the number of erasures of the superblock 91 has reached a prescribed value, is subsequently decided (step (b)). When the prescribed number of times has not been reached, the, erase management routine returns to the main routine. On the other hand, when the prescribed number of erasures has been reached, the numbers of erasures of all the superblocks 91 are examined to seek out the superblock 91 which has the smallest number of erasures and whose data has not been replaced (step (c)). Subsequently, the data of the two superblocks 91 are replaced with each other (step (d)). Further, the replacement flags of both the superblocks 91 are raised (step (e)), and the contents of the relevant tables are rerecorded (step (f)).

The merits of this embodiment are as stated below. In a memory wherein data can be erased in sector unit, erase operations are managed in plural-sector unit, thereby simplifying the erase management. Especially in rewriting a file of large storage capacity, there are attained the effects that a wait time can be shortened and that the storage capacity of the erase management table 101 can be reduced. Accordingly, the fifth embodiment is suited to storage devices of large capacities in which it is difficult to manage the erase operations in sector units.

Now, the tables such as the logical sector table and the physical sector table, which are the constituents of the embodiments described before, will be explained in more detail. The flash memory is a nonvolatile memory. It is accordingly natural that data in the flash memory are not lost even when the system of the present invention has its power supply cut off while it is not operating. However, when the contents of the tables are lost, the data saved in the flash memory become incomprehensible and meaningless data because the corresponding relations of the data to sectors becomes unknown. Therefore, the information stored in the tables also needs to be obtained after the cutoff of the power supply. It is not necessary, however, to save all the information in the tables. The information of the logical sector table, for example, can be easily originated from the information of the physical sector table. The converse is also possible. That is, the information of either of the tables may be saved.

Therefore, the physical sector table is stored in an electrically erasable and programmable read-only memory (EEPROM) which is nonvolatile, while the logical sector table is originated from the physical sector table by the processor at the start of the system at which the power supply is initiated. Thus, a volatile memory can be employed as the logical sector table.

Likewise, the number-of-written-sectors table for respective blocks can be originated from the physical sector table. It is therefore originated in a volatile memory at the start of the system.

The tables mentioned above can also be developed in the main memory of the main system. The other tables are the erase management table and the status table, which cannot originate from any table. The erase management table is stored in an EEPROM because the information thereof ought not to be lost. The status table is obtained when data is written or erased once more, but this table should be stored in an EEPROM in order to avoid repetitive trouble. For the purpose of saving a memory capacity, however, it can be stored also in a volatile memory.

Regarding the storage media of the tables, the number of chips can also be reduced by storing the tables in an identical memory chip. By way of example, since both the physical sector table and the number of erasures table ought to be stored in nonvolatile memories, they are stored in the identical EEPROM chip. Then, only one EEPROM chip is necessary.

Besides, when the processor is implemented by a one-chip microcomputer, a table of comparatively small storage capacity, such as the number-of-written-sectors table, is stored in a RAM core which is built into the one-chip microcomputer.

Figure 22:
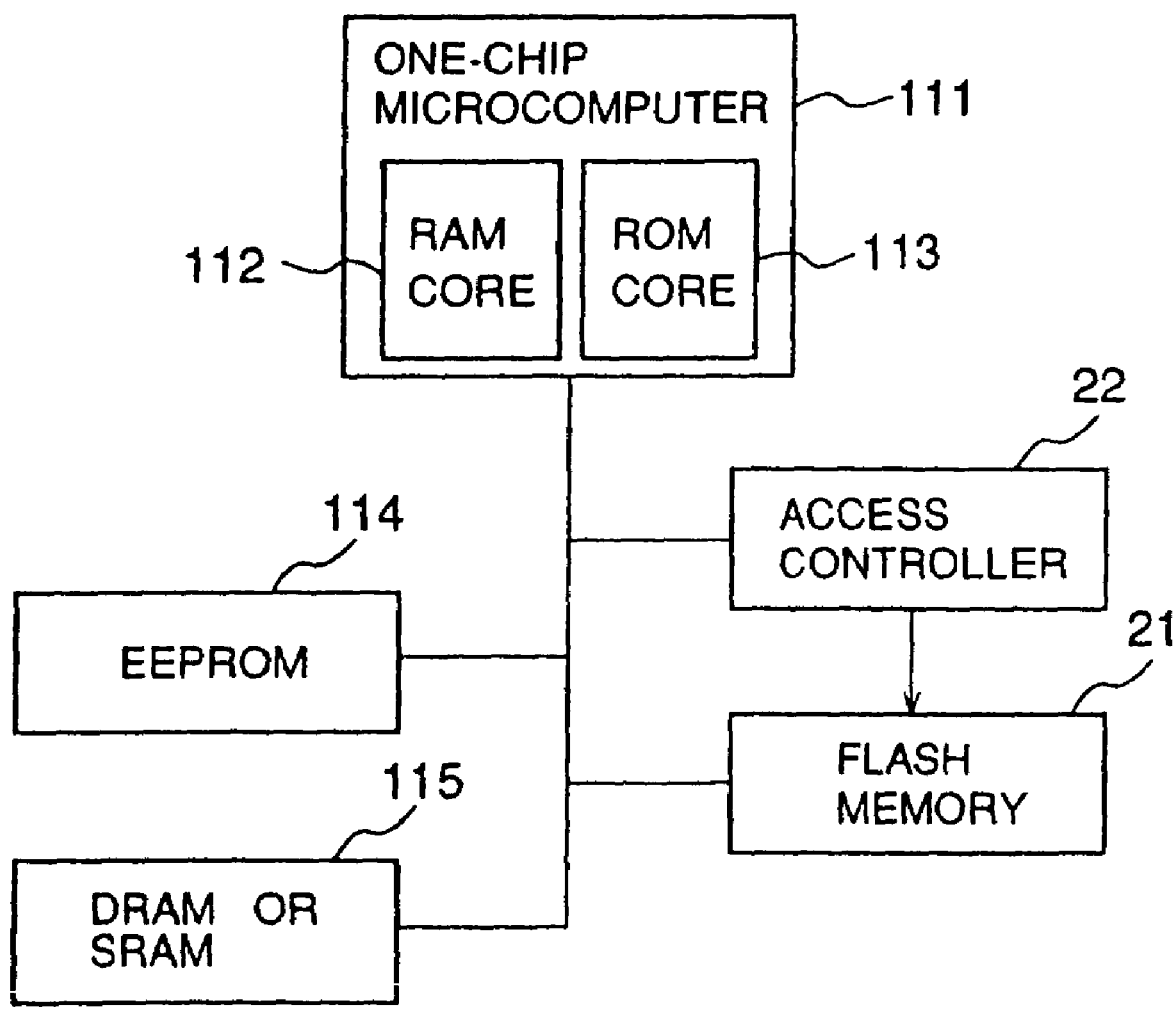
FIG. 22 is a diagram showing the hardware architecture of the sixth embodiment of the present invention.

The architecture of the sixth embodiment in which the above measures concerning the tables are collectively taken, is illustrated in FIG. 22. Referring to the figure, numeral ill indicates a one-chip microcomputer, in which a RAM core 112 and a ROM core 113 are built. Numeral 114 denotes an EEPROM chip, and numeral 115 an SRAM or DRAM. This embodiment also includes a flash memory 21 and an access controller 22 which are the same as those explained before, respectively.

The number-of-written-sectors table is stored in the RAM core 112, while control programs for the microcomputer proper are stored in the ROM core 113. The physical sector table and the erase management table are stored in the EEPROM 114, while the logical sector table is stored in the RAM 115. In addition, the empty area of the RAM 115 is used as the arrangement buffer (51 in FIG. 14) in the case of executing the arrangement routine shown in FIG. 18 and the write buffer (50) for heightening the speed of a write operation.

In this manner, according to the sixth embodiment, the tables and the buffers are collectively formed in accordance with the features of the storage media, whereby the number of chips can be reduced.

Figure 23:
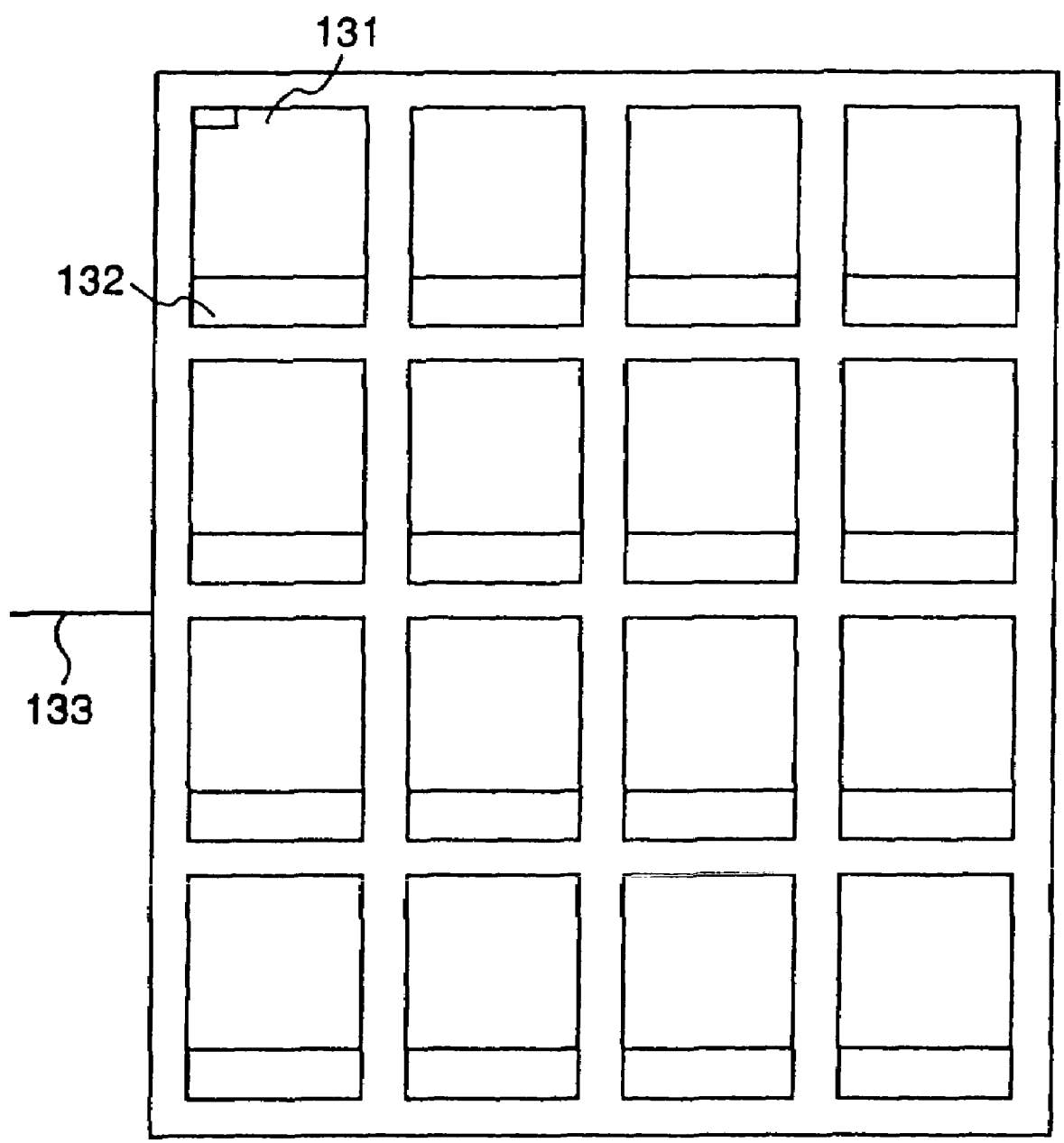
FIG. 23 is a diagram showing the configuration of a flash memory chip which is furnished with a table for every erase block.
Figure 24:
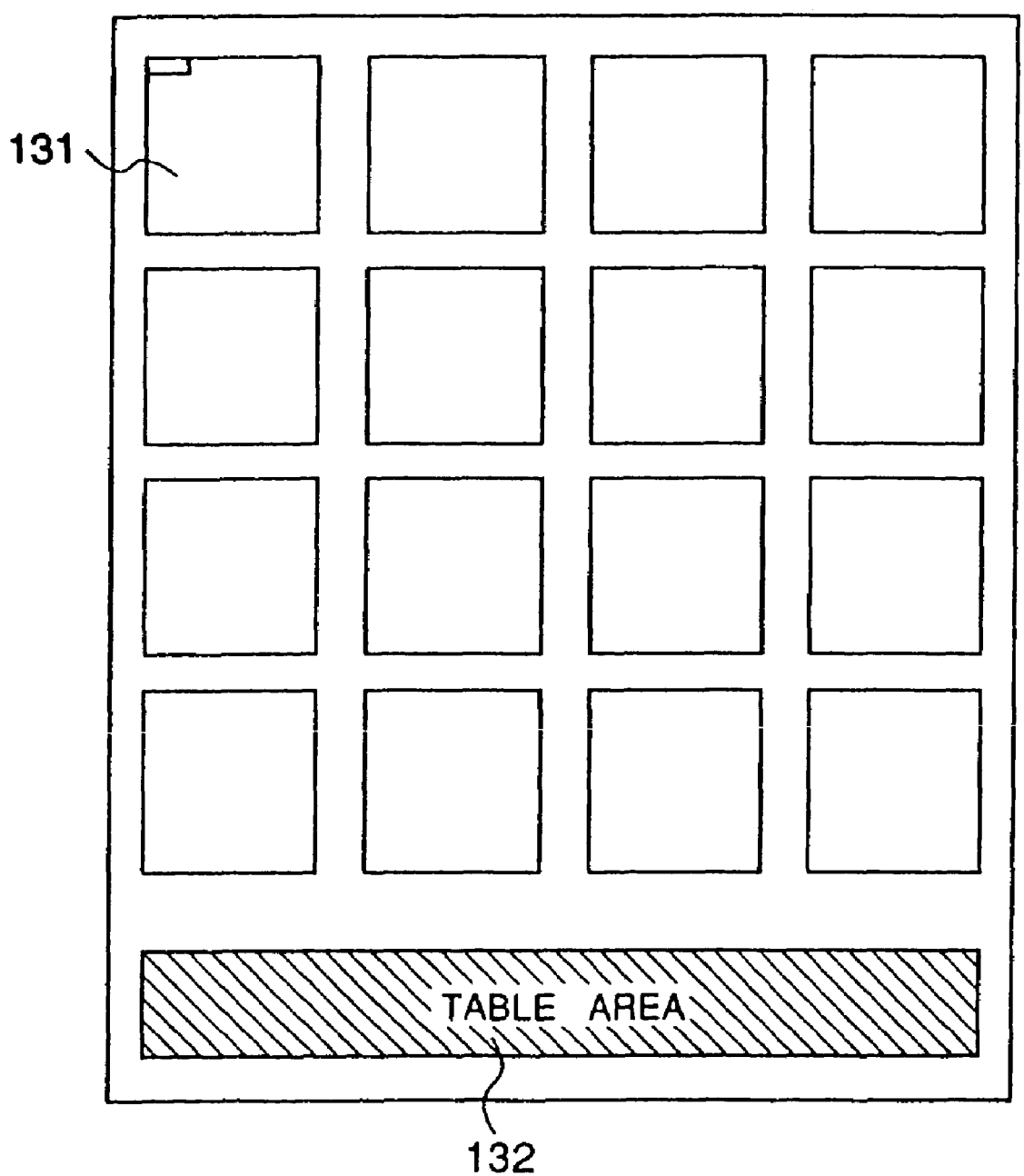
FIG. 24 is a diagram showing the configuration of a flash memory chip which is furnished with an information storing area separately from data areas.
Figure 25:
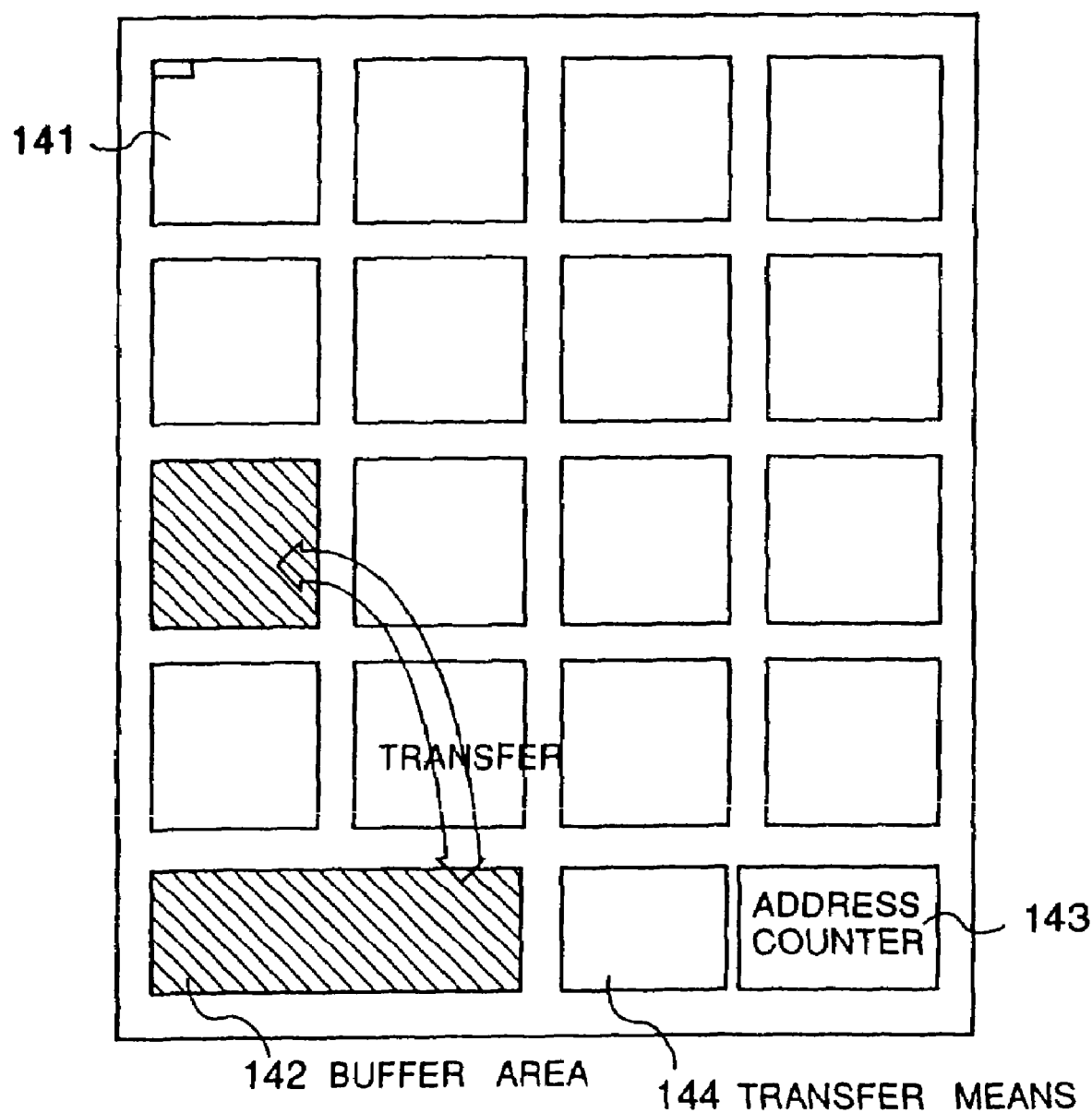
FIG. 25 is a diagram showing the configuration of a flash memory chip which is furnished with a buffer area separately from data areas.

Further, embodiments concerning the configuration of the flash memory itself are illustrated in FIG. 23, FIG. 24 and FIG. 25.

The embodiment in FIG. 23 consists of a flash memory chip in which a storage area for tables, differing from a data area is provided in erase block unit. The management information of the physical sector table, the number of erasures management table, etc. of each corresponding block are written into the table storing area, whereby the EEPROM can be dispensed with. In the figure, numeral 131 indicates an erase block, and numeral 132 the table storing area additionally provided for every erase block 131. The information stored in the area 132 corresponding to the erase block 131 are made accessible by the same address as that of the erase block 131. Herein, the information in these tables are selected by the signals of a signal line 133 being acceptance means, to thereby be distinguished from the file data stored in the data area.

This expedient equalizes the service lives of the data area 131 and the table area 132. That is, it can avoid a situation where the block becomes unusable because the table area 132 is broken in spite of the usable status of the data area 131. Such a tendency intensifies more when the data area 131 and the table area 132 are closer to each other. Moreover, since the tables are formed for every erase block 131, address lines can be shared with ease.

Incidentally, the acceptance means may well receive information on modes so as to select the information of the tables.

The embodiment in FIG. 24 is such that a collective table area 132 is provided separately from data areas 131, thereby dispensing with the EEPROM. This embodiment also attains the effect that, since memory cells are gathered within a chip, they are simpler in construction than memory cells in FIG. 23.

The embodiment in FIG. 25 consists of a flash memory chip in which a buffer area 142 for latching data is provided separately from areas 141 for storing data. The part 142 may well be a volatile memory. Numeral 143 indicates an address counter which counts up in accordance with clock inputs. Shown at numeral 144 is transfer means functioning as both first transfer means and second transfer means.

When a write access is received, the first transfer means writes data to-be-written into the buffer area 142. Besides, when an address is input, the second transfer means transfers a plurality of items of data to the corresponding data area 141 at one stroke so as to be written thereinto. With such a memory, the write buffer which is externally mounted for heightening the speed of a write operation can be omitted. In a read operation, a plurality of items of data can be transferred contrariwise from the data area 141 to the buffer area 142 at one stroke by inputting an address. Also, a read access is simplified.

In this case, the memory becomes more convenient in such a way that the buffer area 142 is constructed as a serial access memory, making it unnecessary to apply successive addresses as inputs. Then, when the clock inputs are applied, the internal address counter 143 counts up, whereby the successive data areas 141 can be accessed to deliver the stored data.

It is most effective to construct the buffer area 142 in sector units. This buffer area is not restricted to one sector unit, but it can include a plurality of sector units in order to enhance the buffering effect thereof. By way of example, when one sector is an erase block unit, the buffer area 142 whose capacity corresponds to one sector can write or read the data of one sector at a time. The buffer area 142 whose capacity corresponds to a plurality of sectors can accept accesses for writing the data of the plurality of sectors, and can prepare the data of the plurality of sectors to-be-read-out. Further, this buffer area 142 is effective to omit the arrangement buffer 51 which is externally mounted.

The third embodiment et seq. of the present invention bring forth effects as stated below.

In the data management scheme of an auxiliary storage employing a flash memory which is limited in the number of erase operations, even when specified logical sector addresses are frequently rewritten, the same physical storage areas are not used. Besides, when the number of erasures has increased in a certain area, the data of the area is replaced with that of an area whose number of erasures is small, to thereby uniformalizing increases in the numbers of erasures. Therefore, the service life of the whole storage system is extended.

In addition, the number of data memory elements may correspond to an actual capacity for storing the file data of the system, and no redundant memory element is required.

Further, in a case where the memory is formed, not only with data areas, but also with an information holding area and a data buffer area, the numbers of elements of peripheral circuits can be decreased to reduce the size of the whole system.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A storage device, comprising:
 a flash memory chip electronically erasable in units of erasure blocks; and
 a controller for accessing to the flash memory chip in response to an access from an external host system,
 wherein the flash memory chip comprises a data area that stores data corresponding to the access from the external host system and a volatile memory that temporally stores the data corresponding to the access from the external host system, and
 wherein a capacity of the volatile memory corresponds to a plurality of the erasure blocks.

2. A storage device according to claim 1, wherein the volatile memory is provided in the flash memory chip in place of another buffer that is provided outside the flash memory chip.

3. A storage device according to claim 1, wherein the flash memory chip transfers the data from the volatile memory to the data area at a write access and transfers the data from the data area to the volatile memory at a read access.

4. A storage device according to claim 3, wherein the flash memory chip transfers the data from the volatile memory to the data area according to an address input thereto at the write access and transfers the data from the data area to the volatile memory an address input thereto at the read access.

5. A storage device according to claim 3, wherein the flash memory chip transfers a plurality of items of the data from the volatile memory to the data area together at the write access and transfers a plurality of items of the data from the data area together at the read access.

6. A storage device according to claim 1, wherein the flash memory chip is accessible to successive addressees according to a clock input thereto without inputting successive addressees.

7. A storage device according to claim 6, wherein the flash memory chip further comprises:
   a address counter, and
   wherein the flash memory chip counts up the address counter to make the successive addressees.

8. A storage device according to claim 1, wherein each erasure block in the flash memory chip stores the data and conversion information between a logical address for the external host system and a physical address for the flash memory chip.

9. A storage device according to claim 1, wherein the flash memory chip is coupled to the controller via a bus.

* * * * *